United States Patent
Cass et al.

(10) Patent No.: US 12,336,097 B2
(45) Date of Patent: Jun. 17, 2025

(54) METAL-CONTAINING FABRICS AND MEMBRANES, AND METHOD OF MANUFACTURING THEREOF

(71) Applicant: IMPERIAL COLLEGE INNOVATIONS LIMITED, London (GB)

(72) Inventors: Anthony Edward George Cass, London (GB); Stefan Maier, London (GB); Thao Thi Le, London (GB); Firat Guder, London (GB); Maximilian Grell, London (GB); Michael Kasimatis, London (GB); Giandrin Barandun, London (GB); Estefania Nunez-Bajo, London (GB); Can Dincer, London (GB); Alberto Lauri, London (GB)

(73) Assignee: IMPERIAL COLLEGE INNOVATIONS LIMITED, London (GB)

( * ) Notice: Subject to any disclaimer, the term of this patent is extended or adjusted under 35 U.S.C. 154(b) by 0 days.

(21) Appl. No.: 17/042,402

(22) PCT Filed: Mar. 29, 2019

(86) PCT No.: PCT/GB2019/050913
§ 371 (c)(1),
(2) Date: Sep. 28, 2020

(87) PCT Pub. No.: WO2019/186188
PCT Pub. Date: Oct. 3, 2019

(65) Prior Publication Data
US 2021/0144851 A1    May 13, 2021

(30) Foreign Application Priority Data
Mar. 29, 2018 (GB) .................... 1805131

(51) Int. Cl.
*H05K 3/12* (2006.01)
*C23C 18/16* (2006.01)
(Continued)

(52) U.S. Cl.
CPC ......... *H05K 1/038* (2013.01); *C23C 18/1653* (2013.01); *C23C 18/1692* (2013.01);
(Continued)

(58) Field of Classification Search
CPC . C23C 18/42; C23C 18/1653; C23C 18/1692; C23C 18/2066; C23C 18/1608;
(Continued)

(56) References Cited

U.S. PATENT DOCUMENTS 4,017,265 A * 4/1977 Taylor .................... H01F 10/16
428/675
4,254,163 A * 3/1981 Piazza .................... B41M 7/02
427/202

(Continued)

FOREIGN PATENT DOCUMENTS

GB         2515306 A    12/2014
JP         53-088961    * 8/1978
(Continued)

OTHER PUBLICATIONS

GB Search and Exam Report for GB1805131.8 dated Sep. 12, 2018, 3 pages.
(Continued)

*Primary Examiner* — Katherine A Bareford
(74) *Attorney, Agent, or Firm* — Linda B. Huber; Nixon Peabody LLP

(57) ABSTRACT

A method of manufacturing a metal fabric or membrane, the method comprises providing an ink comprising a plurality of semiconductor particles disposed in a first solvent. The method comprises applying the ink to a fabric or membrane
(Continued)

to obtain a fabric or membrane comprising a plurality of semiconductor particles. Finally, the method comprises contacting the fabric or membrane comprising the plurality of semiconductor particles with a deposition solution comprising a second solvent, an autocatalytic agent, and metal cations to thereby cause a reaction to occur such that the metal cations are reduced and at least partially displace the semiconductor particles, to thereby provide a metal fabric or membrane.

14 Claims, 14 Drawing Sheets

(51) Int. Cl.
    *C23C 18/42*     (2006.01)
    *H05K 1/03*     (2006.01)

(52) U.S. Cl.
    CPC .............. *C23C 18/42* (2013.01); *H05K 3/12* (2013.01); *H05K 2203/1131* (2013.01)

(58) Field of Classification Search
    CPC ..... C23C 18/1642; C23C 18/38; C23C 18/54; C23C 18/166; H05K 1/038; H05K 1/16; H05K 1/0386; H05K 3/12; H05K 3/182; H05K 3/184; H05K 2203/1131; H05K 2201/0209

See application file for complete search history.

(56) References Cited

U.S. PATENT DOCUMENTS

| | | | | |
|---|---|---|---|---|
| 4,910,049 A | * | 3/1990 | Bindra | ................... H05K 3/181 156/279 |
| 5,384,216 A | * | 1/1995 | Teraoka | ................ H01M 4/383 429/223 |
| 5,424,252 A | | 6/1995 | Morishita | |
| 6,451,689 B1 | * | 9/2002 | Kumamoto | ........... H01L 21/288 257/E21.174 |
| 2004/0224623 A1 | * | 11/2004 | Nishiyama | .............. B24B 37/22 257/E21.244 |
| 2005/0006339 A1 | * | 1/2005 | Mardilovich | ....... C23C 18/1678 216/39 |
| 2005/0241951 A1 | * | 11/2005 | Crouse | ................ C23C 18/1608 205/167 |
| 2005/0260350 A1 | * | 11/2005 | Shipway | ................. C23C 18/30 427/304 |
| 2008/0081388 A1 | * | 4/2008 | Yasseri | .................. B82Y 40/00 438/22 |
| 2011/0111517 A1 | * | 5/2011 | Siegel | ............... B01L 3/502707 436/164 |
| 2016/0369405 A1 | | 12/2016 | Bent | |
| 2020/0028164 A1 | * | 1/2020 | Ay | ........................ H01M 4/587 |

FOREIGN PATENT DOCUMENTS

| | | | | |
|---|---|---|---|---|
| JP | 2017-024185 | * | 2/2017 | |
| JP | 2017-147085 | * | 8/2017 | |
| WO | 2005/117168 A1 | | 12/2005 | |
| WO | 2014/195324 A2 | | 12/2014 | |
| WO | WO-2018145750 A1 | * | 8/2018 | ............. C01B 33/02 |
| WO | 2019/186188 A1 | | 10/2019 | |

OTHER PUBLICATIONS

International Search Report and Written Opinion for PCT/GB2019/050913 dated Jun. 28, 2019, 15 pages.
Bandarenka et al., Nanostructures formed by displacement of porous silicon with copper: from nanoparticles to porous membranes, Nanoscole Research Letters, 2012, pp. 1-10.
Grell et al., Autocatalytic Metallization of Fabrics Using Si Ink, for Biosensors, Batteries and Energy Harvesting, Advanced Functional Materials, 2019, vol. 29, pp. 1-11.
Tobjork et al., Paper Electronics, Advanced Materials, 2011, vol. 23, pp. 1935-1961.

* cited by examiner

METAL-CONTAINING FABRICS AND MEMBRANES, AND METHOD OF MANUFACTURING THEREOF

CROSS-REFERENCE TO RELATED APPLICATIONS

This application is a National Phase of International Application No. PCT/GB2019/050913, filed Mar. 29, 2019, which designated the U.S. and that International Application was published under PCT Article 21 (2) in English. This application also includes a claim of priority under 35 U.S.C. § 119 (a) and § 365 (b) to British patent application No. GB 1805131.8, filed Mar. 29, 2018, the contents of which are herein incorporated by reference in their entirety.

BACKGROUND OF THE INVENTION

The present application is concerned with a method for producing a metal fabric or membrane, and extends to the metal fabric or membrane per se and devices comprising the metal fabric or membrane.

Paper is a nonwoven fabric that enjoys widespread use for printed text and packaging as the cheapest flexible substrate available (≈0.1 cent $dm^{-2}$). This, along with an advanced roll-to-roll manufacturing industry, motivates a search for emerging applications of paper in printed electronics. Paper comprises a mesh of overlapping cellulose fibres with diameter 20 µm. The resulting porosity, combined with the fibre's ability to swell up to 20% in high humidity, leads to an extremely hydrophilic material. The consequential high surface area and stability is fantastic for chemical sensing, but the complex three-dimensional surface is prohibitive for electronic device fabrication [1,2].

Incumbent techniques of metal deposition on paper typically rely on nanoparticle inks that require a binder and a polymer laminate to smooth the rough paper surface. The result is brittle, hydrophobic and expensive [1].

Therefore, there is a demand for metal fabrication process that preserves paper's mechanical and sensing qualities, while maintaining its ultra-low price point.

Conductors deposited on fabrics range from printable conductive polymers (especially PEDOT) and evaporated aluminium, to carbon based inks (including carbon nanotubes, graphite and graphene) and noble metal nanoparticle inks. Silver nanoparticle inks are stable, highly conductive, and they are the most common conductor in paper electronic devices [1]. They are, however, disproportionately expensive ($10 per g) and typically require annealing at 200° C. to form conductive pathways [2]. They also require a binder and are brittle and hydrophobic once dry. This is prohibitive for wet applications such as chemical and biosensing, and detrimental to high surface-area applications such as gas sensing. Alternative inks containing silver microparticles are significantly cheaper, but have a rougher surface, lower conductivity and require thicker and more brittle layers [1].

Printed electronics traditionally need to be printed onto a smooth non-absorbing surface. On fabrics this is facilitated by functional coatings of PE, PP, PET, aluminium or wax, typically deposited by sputtering or photolithography on the rough surface. This significantly increases substrate cost and eliminates recyclability and biodegradability [1,3,4]. While surface coatings are the norm, there have been attempts to form conductive networks throughout the cross-section of fabric substrates. High conductivities have been achieved at room temperature by pressing silver nanowires into paper at high pressure, albeit with high material cost [5].

Meanwhile, many disciplines depend on substrate materials with high conductivities provided by metals, alongside properties provided by fabrics. For instance, the high surface areas of fabrics are indispensable for electrochemical sensing, particularly gas sensing where gases can dissolve on the intrinsically wet cellulose fibres [6]. Similarly, biosensing applications, such as lateral flow assays, require rapid fluidic flow for point of care diagnostics, therefore benefitting from the hydrophilicity offered by fabrics [7]. Furthermore, electrochemical cells discharge more rapidly with high active electronically active surface areas enabled by porous cellulose structures of fabrics [8].

The present invention arises from the inventors' work in attempting to overcome the problems associated with the prior art.

BRIEF DESCRIPTION OF THE DRAWINGS

FIG. 1 panel B shows how wax barriers are printed onto paper and the silicon ink is then applied; and FIG. 1 panels C1-C3 show how the paper is then placed into a bath containing hydrofluoric acid (HF) and metal salts, in particular;

Figure panel C1 shows how metal cations are attracted to electrons in Si valence band; Figure panel C2 shows how electrons (e−) in the Si are attracted to the deposited metal nuclei, catalysing further reduction of metal cations. Si is subsequently oxidised near the metal nuclei, forming $SiO_2$ that is etched away by the HF solution; and Figure panel C3 shows how metal cations in solution deposit preferentially on metal nuclei, which grow accordingly. This creates percolation pathways throughout the entire fabric structure, formed around Si microparticles that sit within the fibres.

Figure 2:
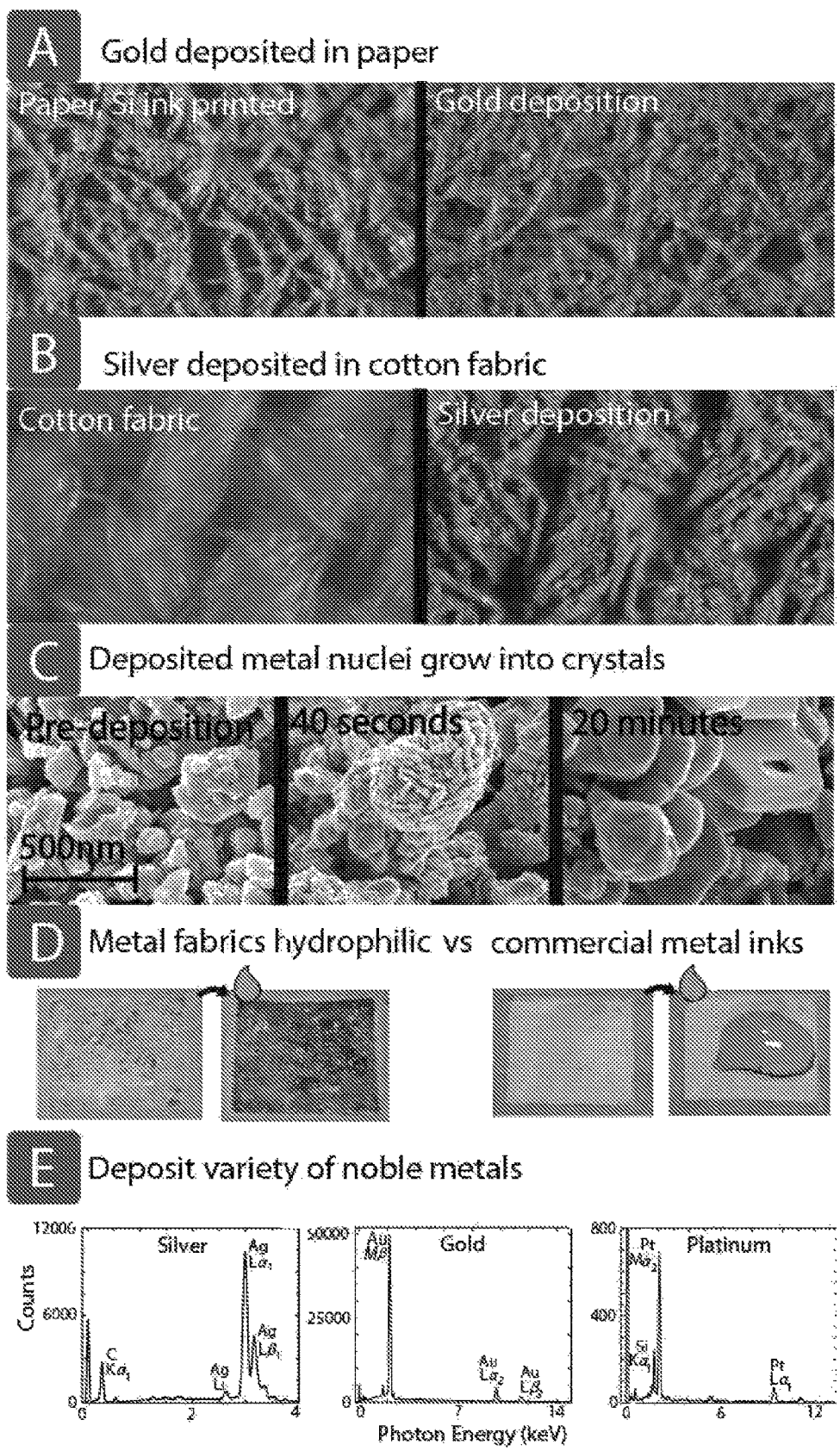
Figure 3:
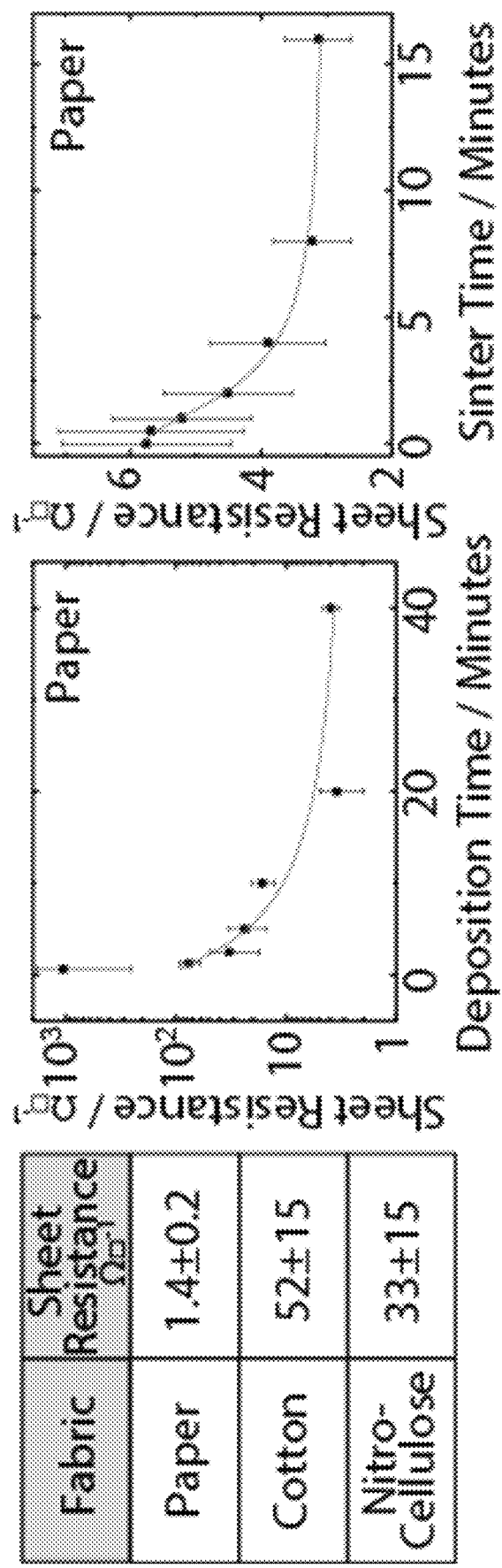

FIG. 2 panel A shows images taken using an optical microscope of paper with an Si ink printed thereon (left), and the paper after gold has been deposited on the Si particles in an autocatalytic reaction (right); FIG. 2 panel B shows images taken using an optical microscope of cotton fabric (left), and the cotton after a silicon ink has been printed thereon and then silver has been deposited on the Si particles in an autocatalytic reaction (right); FIG. 2 panel C shows SEM images of a fabric with an Si ink printed thereon (left), metal nuclei which have formed on the Si particles after autocatalytic deposition has been allowed to occur for 40 seconds (centre), and metal crystals which have formed on the Si particles after autocatalytic deposition has been allowed to occur for 20 minutes (right); FIG. 2 panel D shows how a metal fabric produced in accordance with the current invention is extremely hydrophilic and binder-free (left), whereas commercially available metal nano-particle ink produce fabrics which are hydrophobic and require a binder (right); and FIG. 2 panel E shows energy-dispersive X-ray (EDX) spectra demonstrating a variety of noble metals that can be autocatalytically deposited;

FIG. 3 shows a table (left) containing the achieved sheet resistances for a range of fabrics with a single autocatalytic coating; a graph (centre) showing how sheet resistance decreases with deposition time, as metal crystals grow larger and form more percolation pathways; and a further graph (right) showing how sheet resistance may be decreased further by sintering at 100° C., with further crystal growth causing coalescence.

Figure 4:
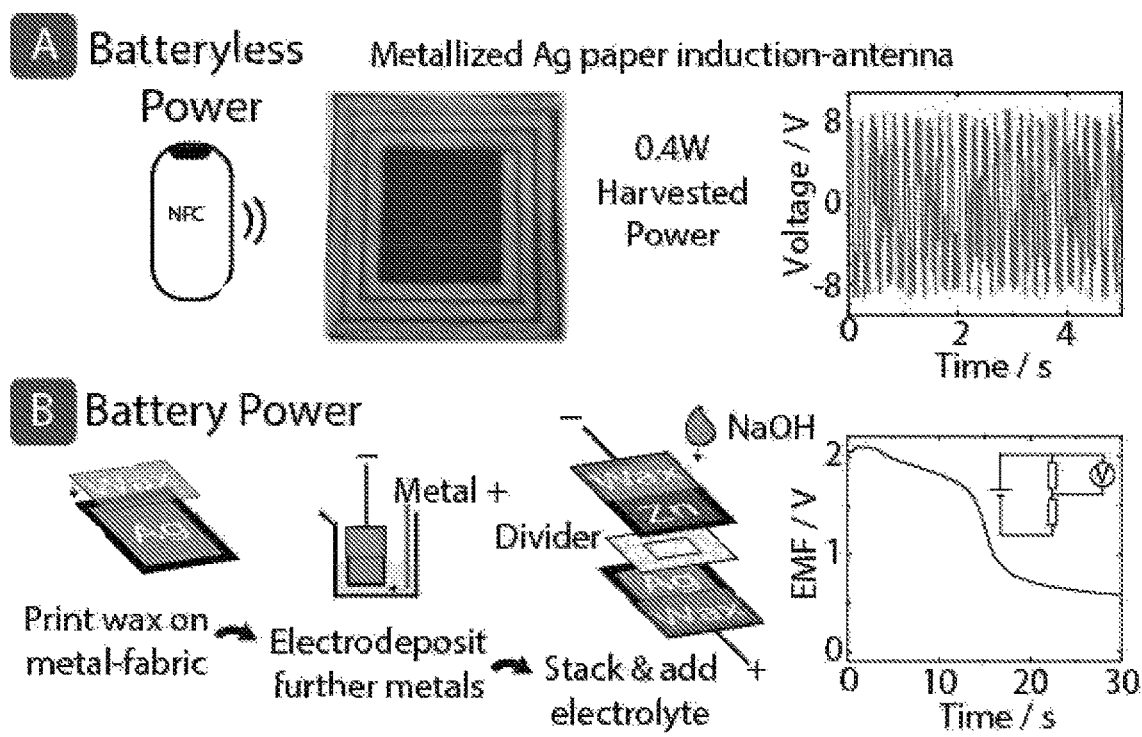

FIG. 4 panel A shows an Ag-paper NFC antenna, with metal cost <$0.01, is capable of harvesting 0.4 W; and FIG.

Figure 5:
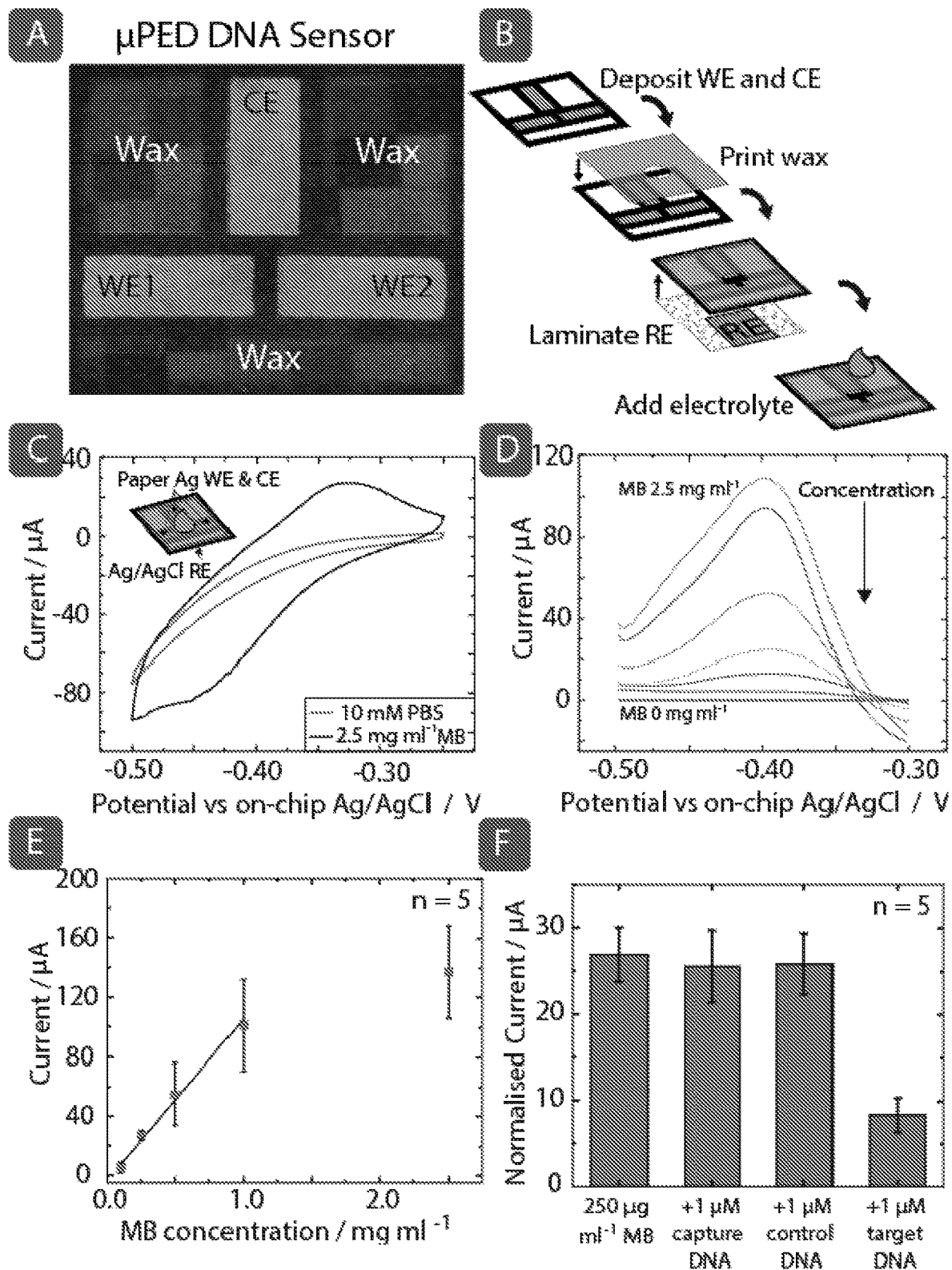
Figure 5:
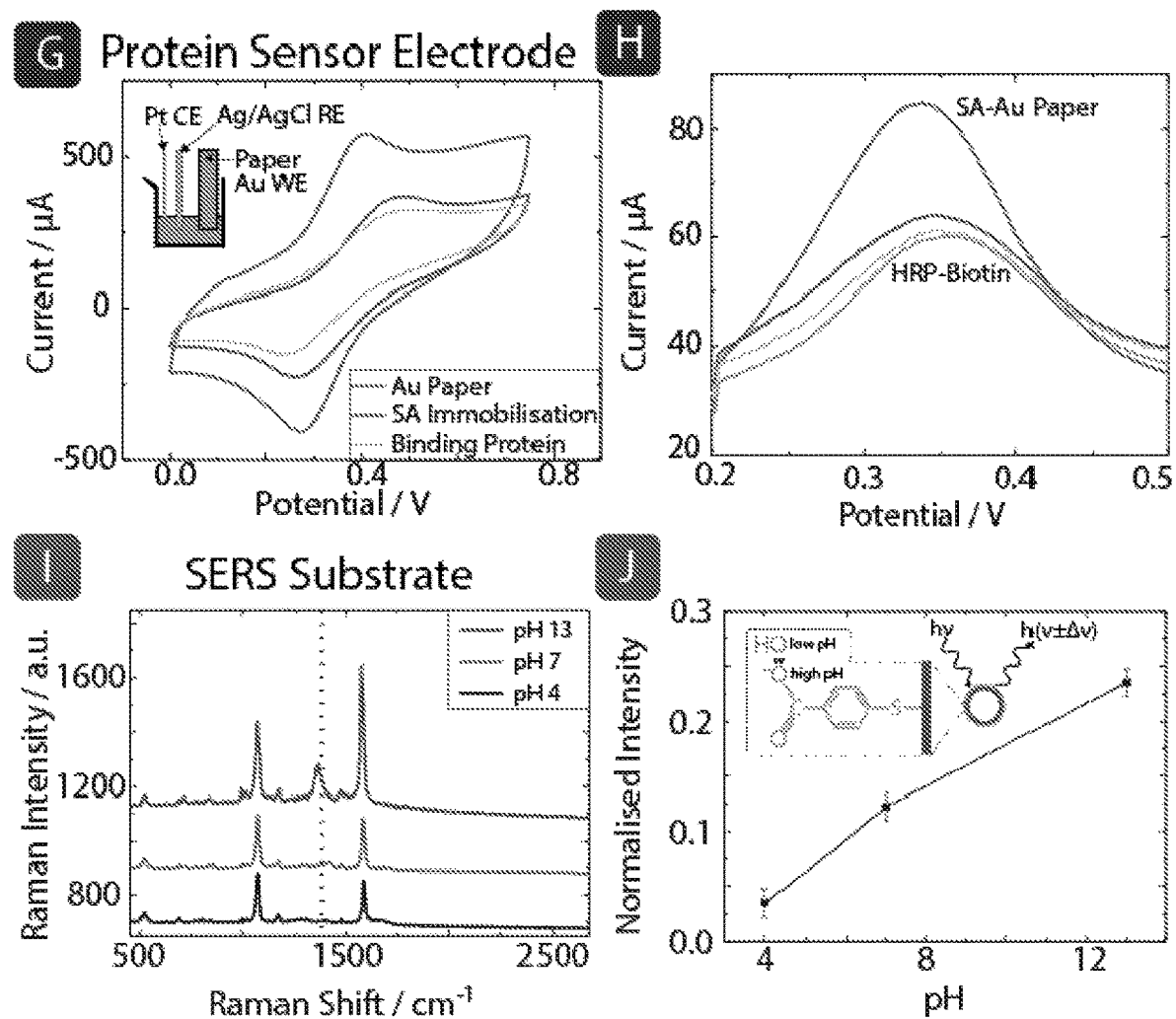
Figure 6:
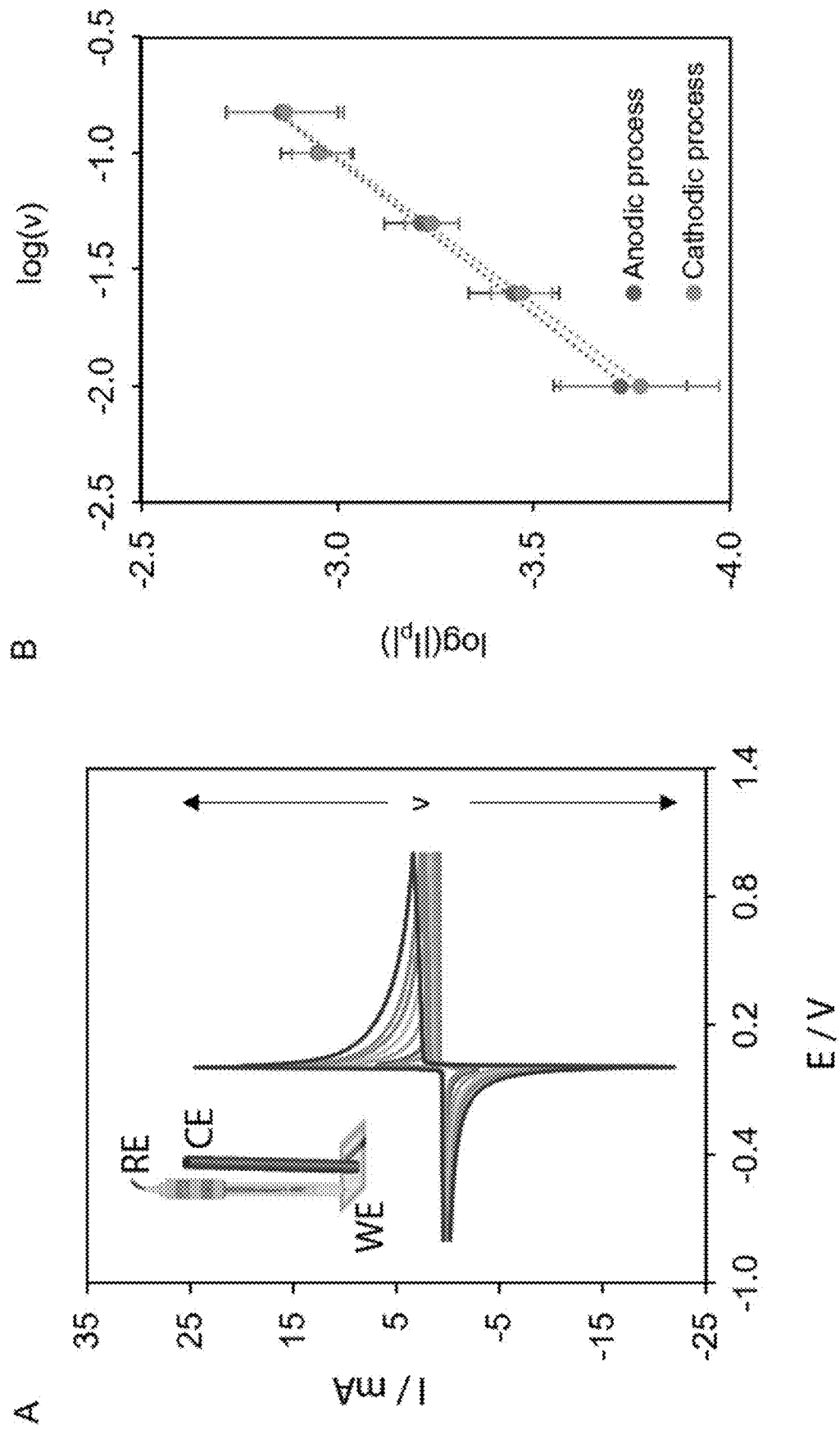
Figure 7:
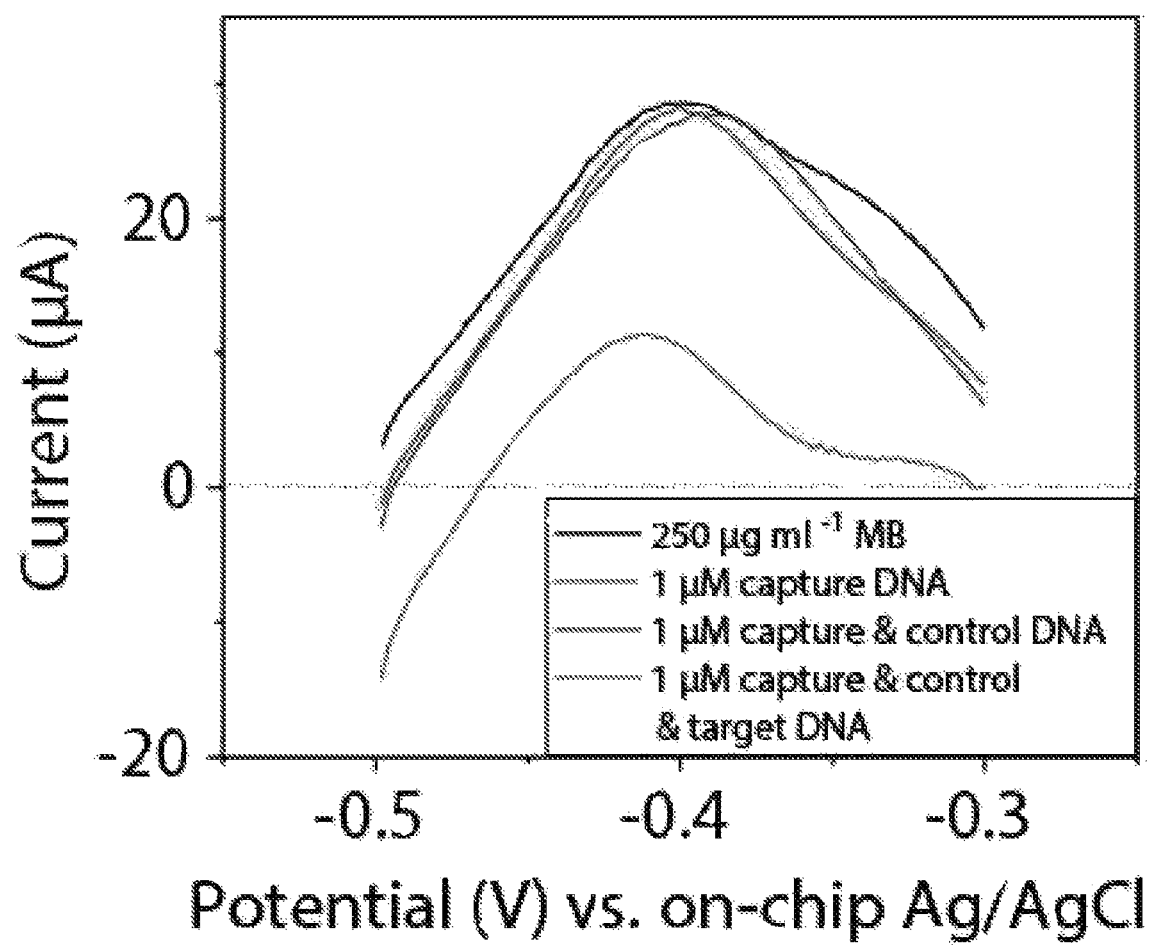
Figure 8:
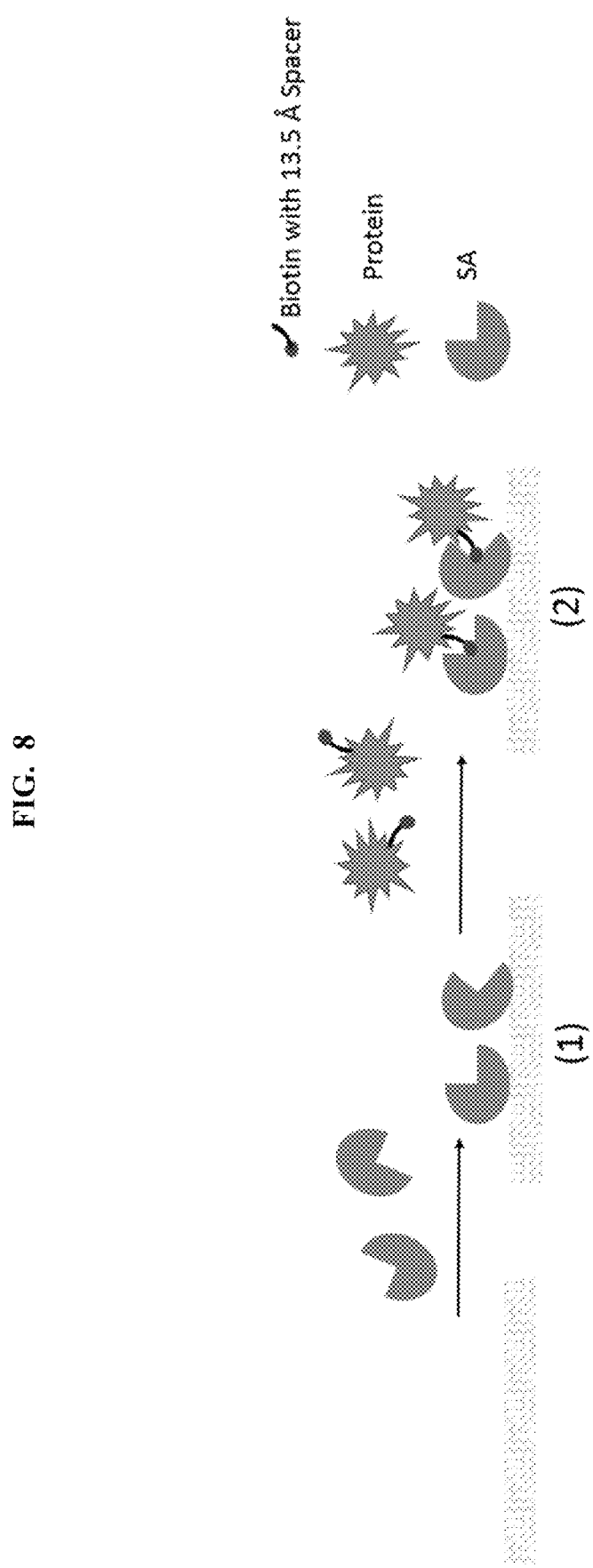
Figure 9:
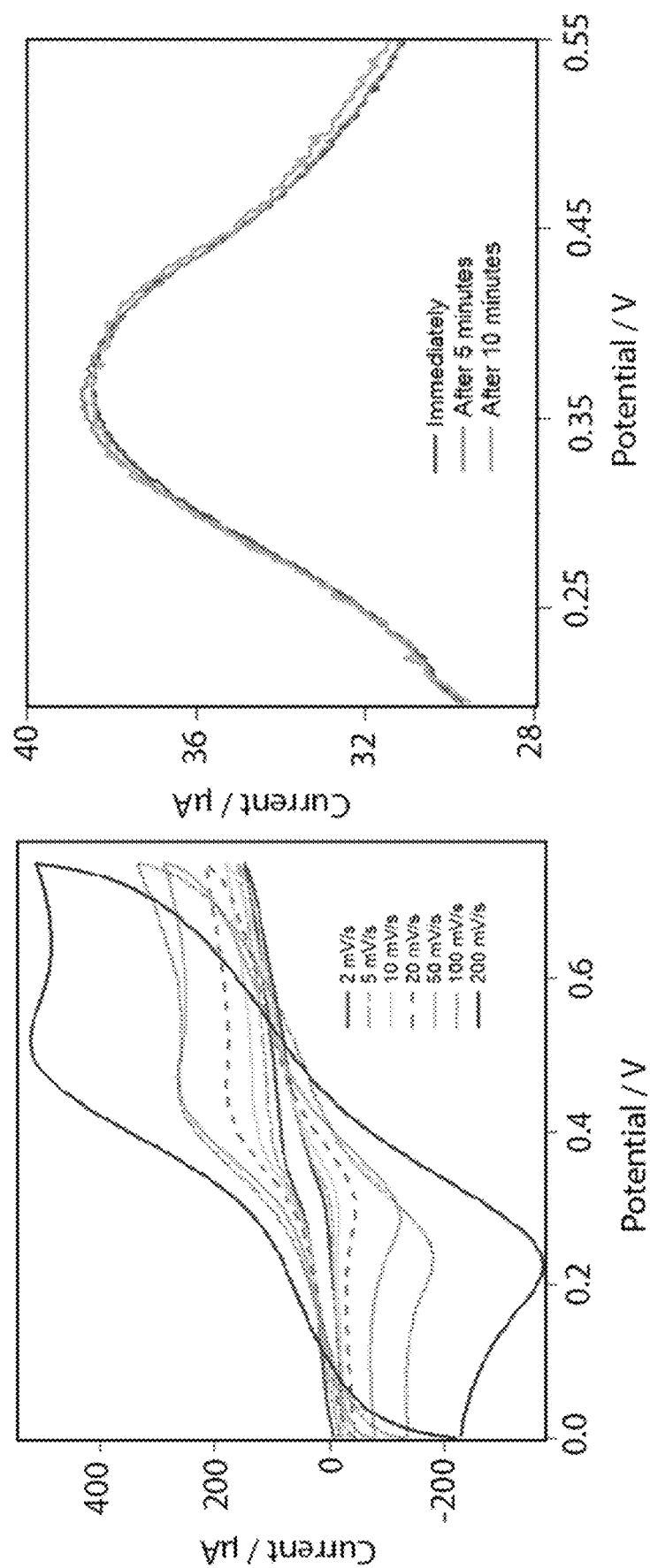

4 panel B shows how further metals may deposited by electroplating, enabling a variety of electrochemical cells such as Zn—Ag or Zn—Cu. Paper Zn—Ag batteries have been fabricated generating $V_{emf}$>2V per cell;

FIGS. 5 panel A and 5 panel B show a µPED that has been fabricated using autocatalytically deposited Ag as the counter and working electrodes; FIGS. 5 panel C to 5 panel E show calibration of the µPED; FIG. 5 panel F shows that methylene blue based DNA detection has been demonstrated with the hybridization of the complementary DNA strains in the presence of another oligo; FIGS. 5 panel G and 5 panel H show that autocatalytic Au paper, coated with streptavidin, has successfully immobilised 50 nM of biotinylated protein; and FIGS. 5 panel I and 5 panel J shows that Au paper has been demonstrated as a substrate for SERS thus enabling pH measurements, by functionalising with 4-MBA (characteristic peak 1,100 $cm^{-1}$), due to protonation of its carboxylic acid end group;

FIG. 6 shows how dependence of the peak current on the scan rate was evaluated by cyclic voltammetry (CV) sweeping the potential from −0.8 to +1.0 V vs. Ag/AgCl at 10, 25, 50, 75, 100, 150 and 200 $mV·s^{-1}$. The metallized Ag paper working electrode (2 cm×2 cm of geometric area) has effective areas of 8.2±0.4 $cm^2$ and 8.6±0.6 $cm^2$ from anodic and cathodic data respectively, calculated from the Randles-Sevcik equation;

FIG. 7 shows how square wave voltammetry of DNA capture show current signals after adding in a row 1 µM capture DNA, 1 µM control DNA and 1 µM target DNA;

FIG. 8 shows binding events on metallized Au paper electrode: (1) SA was immobilised on AuPE through physical adsorption and (2) Biotinylated protein immobilised on the SA;

FIG. 9 is a graph (left) showing CV scans of the SA-AuPE in ECRS at different scan rate ranging from 2 mV/s to 200 mV/s; and a further graph (right) showing SW scans of the biotinylated protein titration at 12.5 nM bitinylated protein to the SA-immobilised AuPE in ECRS at different times; 20

Figure 10:
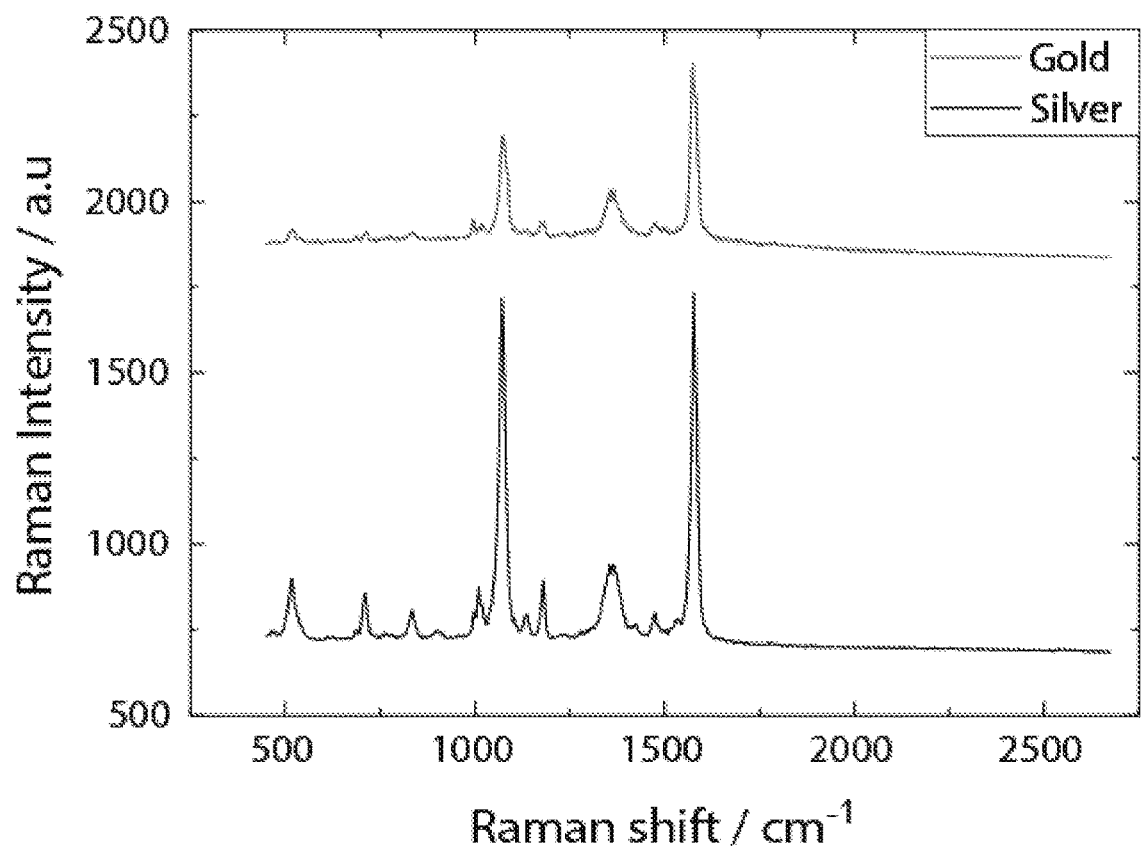
Figure 11:
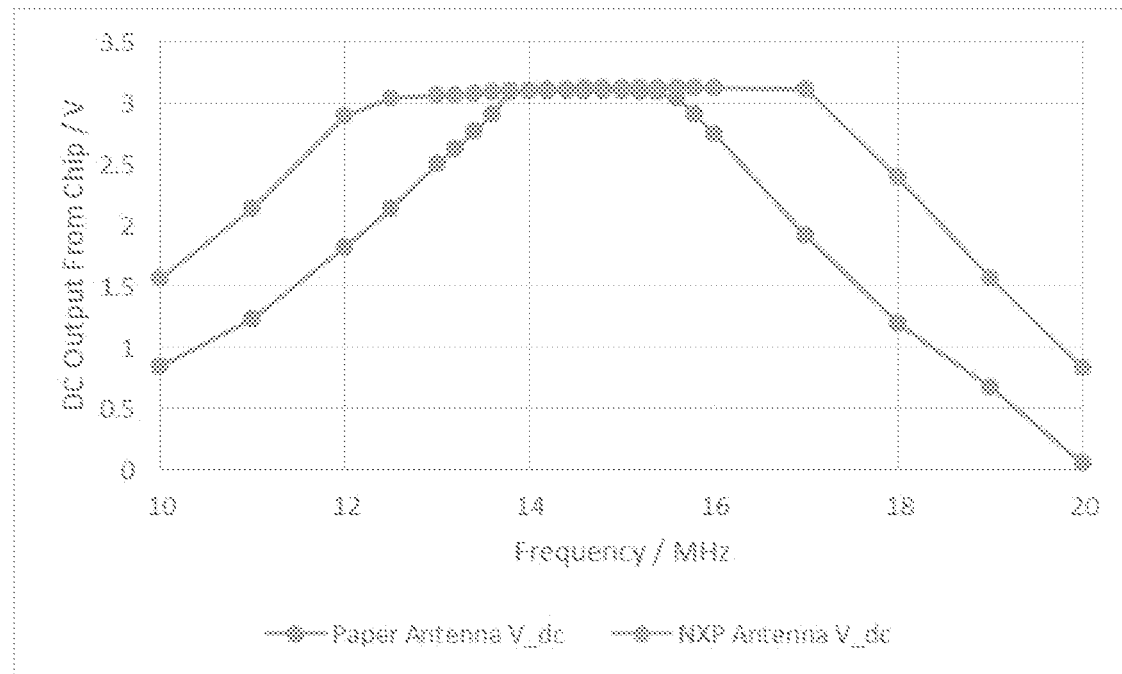
Figure 12A:
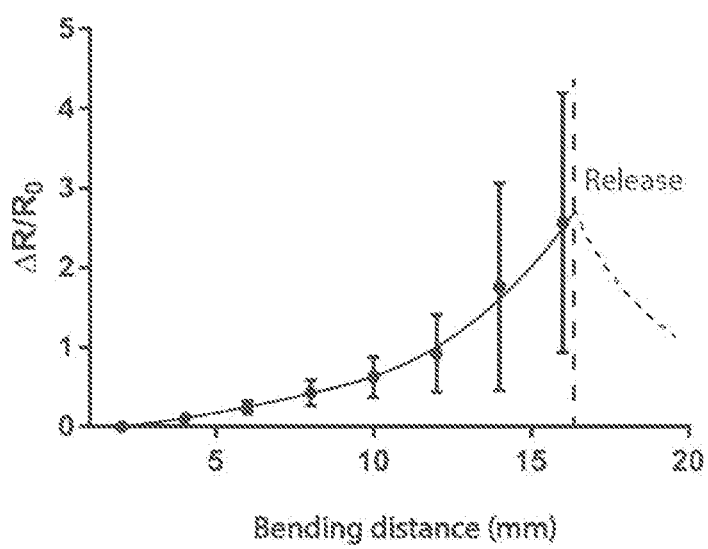
Figure 12B:
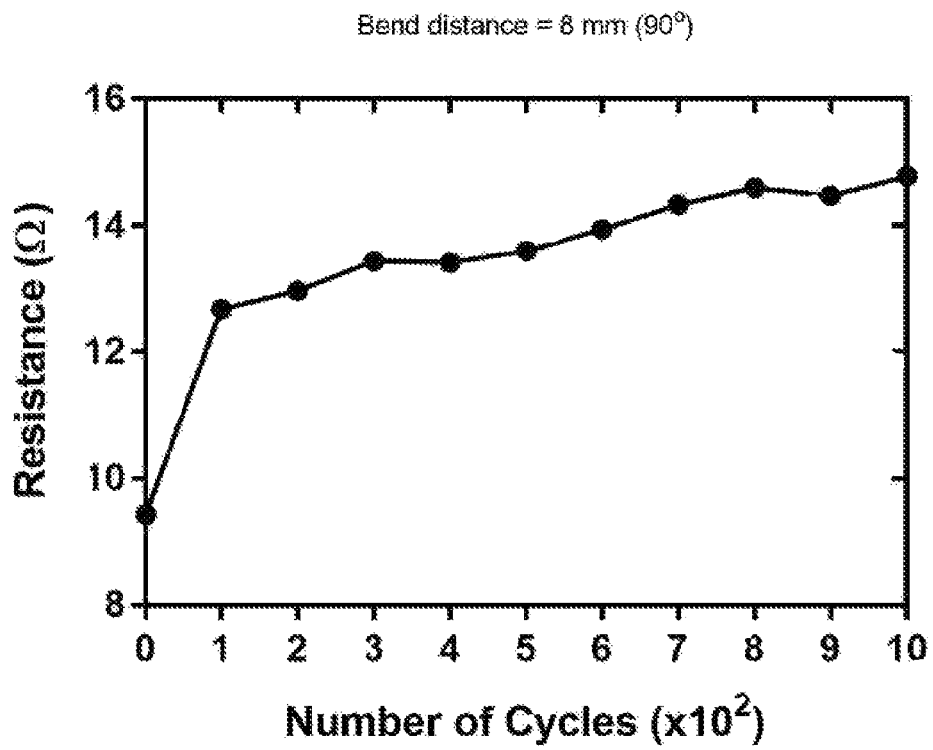
Figure 12C:
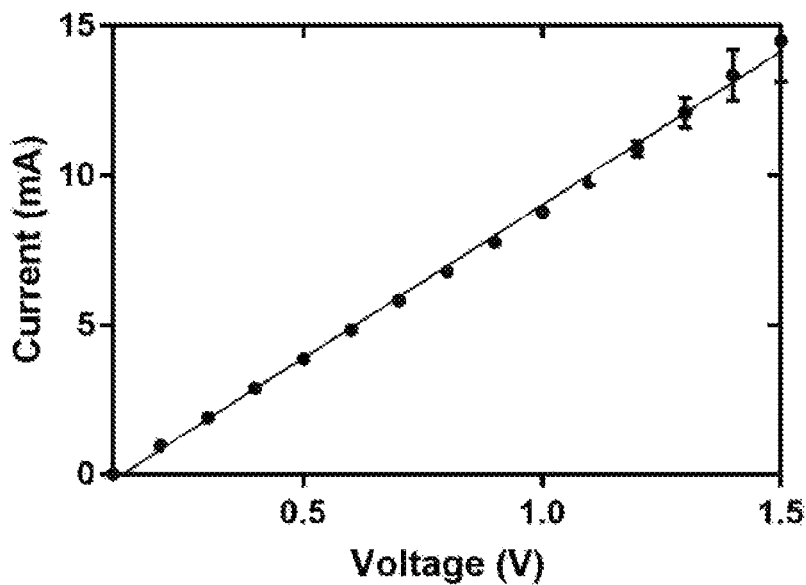
Figure 12D:
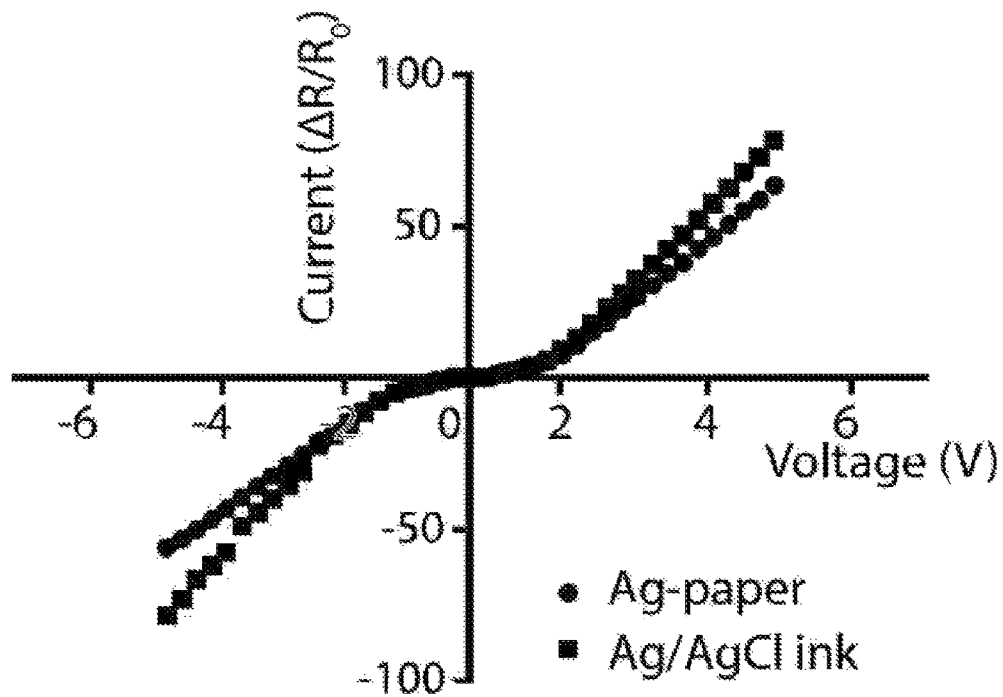
Figure 13:
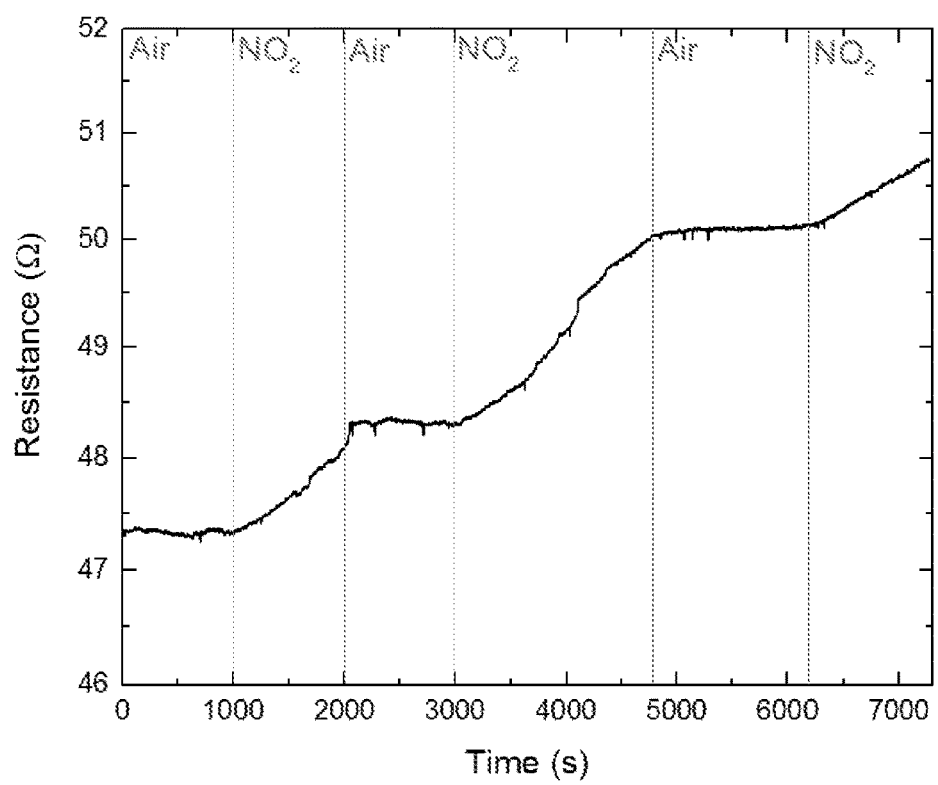

FIG. 10 shows how metallized silver and gold paper demonstrated as SERS substrates by functionalising with the Raman marker 4-MBA, characterised by peaks at 1,100 and 1,590 $cm^{-1}$;

FIG. 11 is a graph showing how the Ag-paper NFC antenna, of FIG. 4A performed compared to a commercial Ag NFC antenna fabricated by chemical etching on a flex polymer substrate;

FIGS. 12A-12D are graphs showing the resistance and current of a silver fabric produced using the present invention; and FIG. 13 is a graph showing how the resistance recorded by a microfluidic device changes when the device is exposed to $NO_2$.

DETAILED DESCRIPTION OF THE INVENTION

In accordance with a first aspect, there is provided a method of manufacturing a metal fabric or membrane, the method comprising:
  providing an ink comprising a plurality of semiconductor particles disposed in a first solvent;
  applying the ink to a fabric or membrane to obtain a fabric or membrane comprising a plurality of semiconductor particles; and
  contacting the fabric or membrane comprising the plurality of semiconductor particles with a deposition solution comprising a second solvent, an autocatalytic agent, and metal cations to thereby cause a reaction to occur such that the metal cations are reduced and at least partially displace the semiconductor particles, to thereby provide a metal fabric or membrane.

Advantageously, the metallic fabrics or membranes produced using the method of the first aspect are highly conductive, electroactive, hydrophilic, flexible, porous and ultra-low cost.

It may be appreciated that the reaction can be viewed as an autocatalytic reaction.

A metal fabric or membrane may be understood to comprise a fabric or membrane with a plurality of particles disposed in or on the fabric or membrane, wherein the particles comprise a semiconductor core with a metal disposed thereon.

The semiconductor particles may comprise an organic semiconductor or an inorganic semiconductor. The inorganic semiconductor may comprise silicon (Si), germanium (Ge), gallium arsenide (GaAs) or gallium nitride (GaN). In a preferred embodiment, the semiconductor particles comprise silicon particles.

It may be appreciated that the size of the semiconductor particles may depend upon the fabric or membrane. Preferably, the semiconductor particles should be sized to substantially correspond to the pore size of the fabric or membrane. Preferably, the plurality of semiconductor particles have a mean diameter of less than 1000 µm, more preferably less than 100 µm, less than 75 µm, less than 50 µm or less than 25 µm, and most preferably less than 10 µm. Preferably, plurality of semiconductor particles have a mean diameter of at least 0.005 µm, more preferably at least 0.01 µm, at least 0.1 µm, at least 0.5 µm or at least 0.75 µm, and most preferably at least 1 µm. Preferably, the plurality of semiconductor particles have a mean diameter of between 0.005 µm and 1000 µm, more preferably between 0.01 µm and 100 µm, between 0.1 µm and 75 µm, between 0.5 µm and 50 µm or between 0.75 µm and 25 µm, and most preferably between 1 µm and 10 µm.

The concentration of the semiconductor particles in the first solvent is preferably less than 10 g $ml^{-1}$, more preferably less than 1 g $ml^{-1}$, less than 800 mg $ml^{-1}$, less than 600 mg $ml^{-1}$ or less than 400 mg $ml^{-1}$, and most preferably less than 300 mg $ml^{-1}$ or less than 200 mg $ml^{-1}$. The concentration of the semiconductor particles in the first solvent is preferably at least 1 mg $ml^{-1}$, more preferably at least 10 mg $ml^{-1}$, at least 20 mg $ml^{-1}$, at least 40 mg $ml^{-1}$ or at least 60 mg $ml^{-1}$, and most preferably at least 80 mg $ml^{-1}$ or at least 90 mg $ml^{-1}$. The concentration of the semiconductor particles in the first solvent is preferably between 1 mg $ml^{-1}$ and 10 g $ml^{-1}$, more preferably between 10 mg $ml^{-1}$ and 1 g $ml^{-1}$, between 20 mg $ml^{-1}$ and 800 mg $ml^{-1}$, between 40 mg $ml^{-1}$ and 600 mg $ml^{-1}$ or between 60 mg $ml^{-1}$ and 400 mg $ml^{-1}$, and most preferably between 80 mg $ml^{-1}$ and 300 mg $ml^{-1}$ or between 90 mg $ml^{-1}$ and 200 mg $ml^{-1}$.

The ink preferably also comprises a stabiliser. The stabiliser may comprise a water soluble polymer, such as carboxymethyl cellulose (CMC).

The stabiliser can be used to control the viscosity of the ink. Accordingly, if a more viscous ink is required a higher concentration of stabiliser may be used. Alternatively, if a less viscous ink is required then a lower concentration of stabiliser may be used. It may be appreciated that a less viscous ink may be used in applications were the ink is required to permeate through a thick fabric or membrane and a more viscous ink may be used in applications where permeation is undesirable.

The concentration of the stabiliser in the ink is preferably less than 1 g ml$^{-1}$, more preferably less than 100 mg ml$^{-1}$, less than 80 mg ml$^{-1}$, less than 60 mg ml$^{-1}$ or less than 40 mg ml$^{-1}$, and most preferably less than 30 mg ml$^{-1}$ or less than 20 mg ml$^{-1}$. The concentration of the stabiliser in the ink is preferably at least 0.1 mg ml$^{-1}$, more preferably at least 1 mg ml$^{-1}$, at least 2 mg ml$^{-1}$, at least 4 mg ml$^{-1}$ or at least 6 mg ml$^{-1}$, and most preferably at least 8 mg ml$^{-1}$ or at least 9 mg ml$^{-1}$. The concentration of the stabiliser in the ink is preferably between 0.1 mg ml$^{-1}$ and 1 g ml$^{-1}$, more preferably between 1 mg ml$^{-1}$ and 100 mg ml$^{-1}$, between 2 mg ml$^{-1}$ and 80 mg ml$^{-1}$, between 4 mg ml$^{-1}$ and 60 mg ml$^{-1}$ or between 6 mg ml$^{-1}$ and 40 mg ml$^{-1}$, and most preferably between 8 mg ml$^{-1}$ and 30 mg ml$^{-1}$ or between 9 mg ml$^{-1}$ and 20 mg ml$^{-1}$.

The first solvent may be any solvent configured to dissolve the stabiliser. Accordingly, the first solvent preferably comprises a polar solvent, such as water or an alcohol, and preferably comprises water. Preferably, the water is deionised water.

The method may comprise an initial step of manufacturing an ink. The method may comprise disposing the plurality of semiconductor particles in the first solvent.

The method may comprise processing a plurality of semiconductor particles to obtain a plurality of semiconductor particles with a desired mean diameter. The desired mean radius may be the mean radius defined above. The method may comprise ball milling and/or sonicating the plurality of semiconductor particles until they have the desired mean diameter. Preferably, the method comprises ball milling and then sonicating a plurality of semiconductor particles until they have the desired mean diameter. Preferably, the method comprises processing the plurality of semiconductor particles after they have been disposed in the first solvent.

The method may comprise disposing the stabiliser in the first solvent. Preferably, the stabiliser is disposed in the first solvent after the plurality of semiconductor particles has been processed.

It may be appreciated that a fabric is flexible material comprising a plurality of fibres. The fabric may comprise a woven fabric or a non-woven fabric. It may be appreciated that in a non-woven fabric the fibres are unwoven and are bonded together by a chemical, mechanical, heat or solvent treatment. Conversely, it may be appreciated that in a woven fabric the fibres are woven together. The fabric may comprise a cotton fabric, a linen fabric or a paper fabric. The paper fabric preferably comprises a cellulose paper fabric.

It may be appreciated that a membrane is a flexible material comprising a sheet. The membrane may define a selective barrier. The membrane may comprise a polymeric membrane, such as a nitrocellulose membrane.

Prior to applying the ink to the fabric or membrane, the method may comprise applying a hydrophobic material to the fabric or membrane. Preferably, the hydrophobic material is applied in a manner configured to define hydrophilic channels on the fabric or membrane. Advantageously, the hydrophobic material creates a hydrophobic barrier ensuring that the ink is only applied to the hydrophilic channels. Accordingly, this allows careful control of the area of the fabric or membrane to which the ink is applied.

The hydrophobic material may be printed on the fabric or membrane. The hydrophobic material may be subsequently annealed. The annealing may be carried out at a temperature between 20° C. and 500° C., more preferably between 50° C. and 400° C. or between 100° C. and 300° C., and most preferably between 150° C. and 200° C.

Preferably, the hydrophobic material creates a hydrophobic barrier through the entire cross section of the fabric or membrane.

The hydrophobic material may comprise a wax. The wax may be a natural wax or a synthetic wax. The wax may be paraffin wax.

The ink may be printed on the fabric or membrane. Methods of printing liquid inks on a fabric or membrane are well known. For instance, the ink may be applied using screen printing or ink jet printing.

The ink may be printed on the fabric or membrane to define the shape of an antenna, an electronic interconnect, one or more electrodes and/or a surface enhanced Raman scattering (SERS) substrate. Accordingly, the resultant metal fabric or membrane may comprise an antenna, an electronic interconnect, one or more electrodes, a SERS substrate and/or a microfluidic device for use in detecting a target analyte.

By controlling the viscosity of the ink and/or controlling the size of the semiconductor particles, the ink may be configured to permeate through the fabric or membrane. Accordingly, the resultant metal fabric or membrane may comprise one or more vias.

After the ink has been applied to the fabric or membrane, the method may comprise allowing the solvent to evaporate. The method may be conducted at room temperate.

The method may comprise washing the fabric or membrane prior to applying the deposition solution. The fabric or membrane may be washed using water, preferably deionised water.

The second solvent preferably comprises water, preferably deionised water. The second solvent may comprise a further polar solvent, such as an alcohol. The further polar solvent may tune properties of the films deposited.

It may be appreciated that the semiconductor particles comprise an oxidised outer layer. The oxidised outer layer may be relatively inert. For instance, when the semiconductor particles comprise silicon, the outer layer may comprise silicon dioxide.

The deposition solution may be acidic. Accordingly, the deposition solution may have a pH of less than 7 at 20° C.

The method may comprise contacting the fabric or membrane comprising the plurality of semiconductor particles with the deposition solution at a temperature of less than 60° C., more preferably less than 50° C. or less than 40° C., and most preferably less than 30° C. or less than 25° C. The method may comprise contacting the fabric or membrane comprising the plurality of semiconductor particles with the deposition solution at a temperature between 0° C. and 60° C., more preferably between 5° C. and 50° C. or between 10° C. and 40° C., and most preferably between 15° C. and 30° C. or between 17.5° C. and 25° C. In a preferred embodiment, the method comprises contacting the fabric or membrane comprising the plurality of semiconductor particles with the deposition solution at room temperature.

It may be appreciated that the autocatalytic agent may be any agent capable of reacting with the oxidised outer layer. Accordingly, the autocatalytic agent is preferably configured to remove the oxidised outer layer from the semiconductor particles. It may be appreciated that the autocatalytic agent may remove the oxidised outer layer from the semiconductor particles by etching it away.

The autocatalytic agent may comprise hydrofluoric acid (HF) or a fluoride salt. The fluoride salt may comprise ammonium fluoride ($NH_4F$).

It may be appreciated that the concentration of the autocatalytic agent will affect the speed of the reaction. Accordingly, a higher concentration may be used when it is desirable for the reaction to proceed more quickly. Preferably, the concentration of the autocatalytic agent is less than 50 wt %, more preferably less than 40 wt %, less than 30 wt %, or less than 20 wt %, and most preferably less than 10 wt %. Preferably, the concentration of the autocatalytic agent is at least 0.005 wt %, more preferably at least 0.01 wt %, at least 0.05 wt % or at least 0.1 wt %, and most preferably at least 0.5 wt %. Preferably, the concentration of the autocatalytic agent is between 0.005 wt % and 50 wt %, more preferably between 0.01 wt % and 40 wt %, between 0.05 wt % and 30 wt % or between 0.1 wt % and 20 wt %, and most preferably between 0.5 wt % and 10 wt %.

The first aspect specifies that the metal cations at least partially displace the semiconductor particles. The term "displace" used in this context may be understood to define a physical displacement. Preferably, the metal cations are reduced and deposit on the semiconductor particles. Preferably, atoms or ions within the semiconductor particles are oxidised to provide oxidised atoms or ions. In embodiments where the semiconductor comprises silicon, the silicon may be oxidised to provide silicon dioxide. Preferably, the autocatalytic agent removes the oxidised atoms or ions from the semiconductor particles. It may be appreciated that the autocatalytic agent may remove the oxidised atoms or ions from the semiconductor particles by etching them away.

The metal cations preferably comprise ruthenium cations, rhodium cations, palladium cations, silver cations, osmium cations, iridium cations, platinum cations, gold cations or copper cations. More preferably, the metal cations comprise silver cations, gold cations or platinum cations. The silver cations may be silver (I) cations ($Ag^+$). The gold cations may be gold (III) cations ($Au^{3+}$). The platinum cations may be platinum (IV) cations ($Pt^{4+}$). Since, the method comprises reducing the metal cations, it may be appreciated that the resultant metal fabric or membrane may comprise ruthenium, rhodium, palladium, silver, osmium, iridium, platinum, gold or copper.

The deposition solution may be prepared by dissolving a metal salt in an autocatalytic agent solution. The metal salt may comprise a metal halide or a metal nitrate. The metal halide may comprise a metal chloride.

It may be appreciated that the reaction will progress more quickly if a greater concentration of metal cations are present in the deposition solution. However, lower concentrations of the metal cations may also be used, and might be preferred due to the cost of the reagents. Preferably, the metal cations are present in the deposition solution at a concentration of less than 1 M, more preferably less than 500 mM or less than 100 mM, and most preferably less than 50 mM. Preferably, the metal cations are present in the deposition solution at a concentration of at least 0.5 mM, more preferably at least 1 mM or at least 5 mM, and most preferably at least 10 mM. Preferably, the metal cations are present in the deposition solution at a concentration of between 0.5 mM and 1 M, more preferably between 1 mM and 500 mM or between 5 mM and 100 mM, and most preferably between 10 mM and 50 mM.

The deposition solution may be printed on the fabric or membrane. Advantageously, this would allow the deposition solution to be selectively applied to the regions of the fabric or membrane which comprise the semiconductor particles.

However, in a preferred embodiment, the fabric or membrane is disposed in a bath comprising the deposition solution.

The method may comprise allowing the autocatalytic reaction to occur for a predetermined time. It may be appreciated that the predetermined time will vary depending upon the concentration of the autocatalytic agent. In one embodiment, the predetermined time may be at least 10 seconds, more preferably at least 1 minute, at least 5 minutes or at least 10 minutes, and most preferably at least 15 minutes. The predetermined time may be less than 90 minutes, more preferably less than 75 minutes, less than 60 minutes or less than 45 minutes, and most preferably less than 30 minutes. The predetermined time may be between 10 seconds and 90 minutes, more preferably between 1 minute and 75 minutes, between 5 minutes and 60 minutes or between 10 minutes and 60 minutes, and most preferably between 15 minutes and minutes.

In embodiments where the fabric or membrane has been disposed in a bath, the method may then comprise removing the fabric or membrane from the bath.

After the predetermined time has occurred, the method may comprise washing the fabric or membrane. The fabric or membrane may be washed using water, preferably deionised water.

In some embodiments, the method may comprise applying a further deposition solution comprising a solvent, an autocatalytic agent and further metal cations to the fabric or membrane to thereby cause a further reaction to occur such that the further metal cations are reduced and at least partially displace the semiconductor particles. Preferably, the further metal cations are different to the metal cations in the first deposition solution. Advantageously, the metal fabric or membrane may comprise a combination metal.

Preferably, the definitions given above in relation to the first deposition solution and first reaction also apply to the further deposition solution and further reaction.

For instance, the metal cations in the first deposition solution may be silver cations, and the metal ions in the further deposition solution may be palladium cations. Accordingly, the resultant metal comprises silver, which can act as a conductor, and palladium, which can act as a catalyst.

Alternatively, or additionally, the method may comprise electrodepositing a further metal on the metal fabric or membrane.

The method may comprise disposing the metal fabric or membrane and an electrode comprising the further metal in an electrolyte and applying a voltage across the metal fabric or membrane and the electrode to cause metal atoms of the electrode to oxidise, travel through the electrolyte to the metal fabric or membrane and to then reduce to form a metal on the surface of the metal fabric or membrane.

Electrolysis is well known in the art. Accordingly, the skilled person could select a suitable electrolyte. It may be appreciated that the voltage applied across the metal fabric or membrane and the electrode and the time for which it is applied will vary depending upon the amount of the further metal which is to be deposited on the metal fabric or membrane. Again, these parameters may be selected by the skilled person.

The further metal may comprise any metal which is stable in an electrolyte. For instance, the further metal may comprise aluminium, iron copper, nickel or zinc. Accordingly, the resultant metal fabric or membrane may comprise any metal which is stable in an electrolyte.

Prior to electrodepositing a further metal on the metal fabric or membrane, the method may comprise applying a layer of a hydrophobic material over a portion of the metal fabric or membrane. The hydrophobic material may be as defined above. Advantageously, this prevents the electrolyte from wicking through the fabric or membrane to the source electrode.

After the further metal has been electrodeposited on the fabric or membrane, the method may comprise washing the fabric or membrane. The fabric or membrane may be washed using water, preferably deionised water.

The method may comprise sintering the metal fabric or membrane. The metal fabric or membrane may be sintered by holding the metal fabric or membrane at a predetermined temperature for a predetermined time.

The predetermined temperature may be less than 500° C., more preferably less than 400° C., less than 300° C., or less than 200° C., and most preferably less than 175° C., less than 150° C. or less than 125° C. The predetermined temperature may be at least 60° C., more preferably at least 70° C., at least 75° C., or at least 80° C., and most preferably at least 85° C., at least 90° C. or at least 95° C. The predetermined temperature may be between 60° C. and 500° C., more preferably between 70° C. and 400° C., between 75° C. and 300° C., or between 80° C. and 200° C., and most preferably between 85° C. and 175° C., between 90° C. and 150° C. or between 95° C. and 125° C.

The predetermined time may at least 1 minute, more preferably at least 2 minutes, at least 3 minutes, at least 4 minutes or at least 5 minutes, and most preferably at least 10 minutes. The predetermined time may less than 90 minutes, more preferably less than 75 minutes, less than 60 minutes, less than 45 more or less than 30 minutes, and most preferably less than 20 minutes. The predetermined time may be between 1 minute and 90 minutes, more preferably between 2 minutes and 75 minutes, between 3 minutes and 60 minutes, between 4 minutes and 45 minutes or between 5 minutes and 30 minutes, and most preferably between 10 minutes and 20 minutes.

Advantageously, sintering the metal fabric or membrane increases the conductivity thereof.

The method may comprise forming a layer of a metal oxide on the surface of the metal fabric or membrane. Accordingly, the method may comprise anodising the metal fabric or membrane to form a layer of a metal oxide thereon. For instance, a metal oxide may be desired for use as an electrode.

The inventors believe that a metal fabric or membrane produced using the method of the first aspect is novel and inventive per se.

Accordingly, in accordance with a second aspect, there is provided a metal fabric or membrane obtained or obtainable by the method of the first aspect.

In accordance with a third aspect, there is provided a metal fabric or membrane comprising a fabric or membrane and a plurality of particles disposed in or on the fabric or membrane, wherein the particles comprise a semiconductor core with a metal disposed thereon.

Preferably, the particles are disposed in the fabric or membrane. Preferably, the fabric or membrane, metal and semiconductor are as defined in the relation to the first aspect.

The metal fabric or membrane of the third aspect may be produced using the method of the first aspect.

It may be appreciated, because the metal is deposited on the semiconductor core in situ on or in the fabric or membrane, a portion of the fabric or membrane may be entrapped within the metal. The portion of the fabric or membrane may be a strand or thread thereof. The word entrapped may be understood to mean that the metal layer has formed around the fabric or membrane, such that the particle cannot be removed therefrom without damaging the particle or the fabric or membrane.

In one embodiment, the metal fabric or membrane of the second or third aspect comprises an electrical interconnect. The electrical interconnect may comprise one or more vias. The metal could be any metal. For instance, the metal may be silver, copper or aluminium.

In an alternative embodiment, the metal fabric or membrane of the second or third aspect comprises an antenna, preferably a near-field communication (NFC) antenna. The metal could be any metal. For instance, the metal may be silver, copper or aluminium. In one embodiment, the metal is silver. In one embodiment, the fabric or membrane is a paper fabric and more preferably a cellulose paper fabric.

Advantageously, the metal may extend across the depth of the fabric or membrane. Accordingly, the metal defining the NFC antenna may be thicker than in prior art devices, allowing it to capture electromagnetic radiation more effectively.

In an alternative embodiment, the metal fabric or membrane of the second or third aspect comprises an electrode. Preferably, the electrode comprises a hydrophobic material disposed over a portion of the plurality of particles disposed in the fabric or membrane. Advantageously, this prevents an electrolyte from wicking through the fabric or membrane to the source electrode.

In an alternative embodiment, the metal fabric or membrane of the second or third aspect comprises a surface enhanced Raman spectroscopy (SERS) substrate. Preferably, the metal is gold, silver or copper.

Advantageously, using the method of the first aspect, production of a SERS substrate can easily be scaled to printed large-area manufacture. Furthermore, having a hydrophilic substrate for metal nanoparticles also has several proven advantages such as enhanced mass transport, low dosage and high throughput compared to conventional SERS systems.

In an alternative embodiment, the metal fabric or membrane of the second or third aspect comprises a microfluidic device for use in detecting a target analyte. The microfluidic device may be configured to detect a gas or a vapour. The metal fabric or membrane may comprise an electrode pair disposed on the fabric or membrane. The electrode pair may be disposed on opposing surfaces of the fabric or membrane. The electrode pair may be substantially aligned on the opposing surfaces. The metal may be silver, gold or platinum. In one embodiment, the metal is silver. In one embodiment, the fabric or membrane is a paper fabric and more preferably a cellulose paper fabric.

The microfluidic device may comprise an amplifying agent disposed in or on the fabric or membrane. It may be appreciated that the amplifying agent is an agent configured to amplify a signal of the target analyte. Preferably, the amplifying agent is a compound capable of being ionized by the target analyte.

In accordance with a fourth aspect, there is provided use of the metal fabric or membrane of the second or third aspect as an electrical interconnect, an antenna, an electrode, a SERS substrate and/or a microfluidic device.

In accordance with a fifth aspect, there is provided a battery, a microfluidic paper-based analytical device (µPAD), a chemical transducer or a gas or vapour sensor comprising the metal fabric or membrane of the second or third aspect.

Advantageously, the battery has a high surface area and an ultra-low fabrication cost.

Furthermore, the method of the first aspect allows the deposition of a wide range of metal electrodes for use in the battery.

Preferably, the battery comprises a first half cell comprising a first electrode, a second half cell comprising a second electrode, at least one electrolyte disposed in the first and second half cells and a separator disposed between the half cells and configured to allow the flow of ions between the half-cells.

A first electrolyte may be disposed in the first half cell and a second electrolyte may be disposed in the second half cell. Alternatively, the same electrolyte may be disposed in both half cells.

Preferably, the battery comprises a first metal fabric or membrane, wherein the first metal fabric or membrane is a metal fabric or membrane as defined in the second or third aspect and the first metal fabric or membrane comprises the first electrode.

Preferably, the fabric or membrane is a paper fabric and more preferably a cellulose paper fabric.

Preferably, the battery comprises a second metal fabric or membrane, wherein the second metal fabric or membrane is a metal fabric or membrane as defined in the second or third aspect and the second metal fabric or membrane comprises the second electrode. Preferably, the fabric or membrane is a paper fabric and more preferably a cellulose paper fabric.

Preferably, the first electrode comprises a first metal and the second electrode comprises a second metal. Accordingly, in one embodiment, the first electrode comprises zinc and the second electrode comprises silver or silver oxide. However, it will be appreciated that other metal-based batteries could be provided.

Preferably, the separator is non-conductive and porous. Preferably, the separator is compatible with the electrolyte. The separator may comprise a fabric or a membrane. In one embodiment, the separator comprises a paper fabric and more preferably a cellulose paper fabric.

Preferably, the µPAD comprises first and second working electrodes and a hydrophobic barrier configured to guide a sample into a test zone comprising a portion of each of the first and second working electrodes.

The µPAD may also comprise a common counter electrode. The test zone may comprise a portion of the common counter electrode.

The µPAD may also comprise a pseudo-reference electrode. The pseudo-reference electrode is preferably disposed at least substantially adjacent to a first surface of the metal fabric or membrane. Preferably, the pseudo-reference electrode is disposed at least substantially adjacent to the first and second working electrodes.

Preferably, the test zone is disposed on a second surface of the metal fabric or membrane, wherein the second surface is provided opposite the first surface. Preferably, the hydrophobic barrier comprises a wax. The wax may be as defined in relation to the first aspect.

Preferably, the PAD comprises a metal fabric or membrane as defined in the second or third aspect, wherein the metal fabric or membrane comprises the first working electrode, the second working electrode, the common counter electrode and/or the pseudo-reference electrode. In one embodiment, the metal fabric or membrane comprises the first working electrode, the second working electrode and the common counter electrode. Preferably, the fabric or membrane is a paper fabric and more preferably a cellulose paper fabric. Preferably, the metal is gold, silver or platinum. The pseudo-reference electrode may comprise any material capable of providing a stable reference. For instance, the pseudo-reference electrode may comprise is a silver/silver chloride (Ag/AgCl) electrode.

In one embodiment, the electrochemical transducer is an electrochemical biotransducer. Alternatively, or additionally, the electrochemical transducer may be an amperometric or potentiometric transducer.

Preferably, the electrochemical transducer comprises a working electrode and a reference electrode. Preferably, the electrochemical transducer further comprises a common counter electrode.

Preferably, the electrochemical transducer comprises a metal fabric or membrane as defined in the second or third aspect, wherein the metal fabric or membrane comprises the working electrode, the reference electrode and/or the common counter electrode. In one embodiment, the metal fabric or membrane comprises the working electrode. Preferably, the fabric or membrane is a paper fabric and more preferably a cellulose paper fabric. Preferably, the metal is a noble metal, such as gold, silver or platinum.

Preferably, the metal fabric or membrane comprises a hydrophobic material disposed over a portion of the plurality of particles disposed in the fabric or membrane, the hydrophobic material being configured to prevent the electrolyte from wicking through the fabric or membrane to the source electrode.

Preferably, the reference electrode may comprise any material capable of providing a stable reference. For instance, the reference electrode may comprise a silver/silver chloride (Ag/AgCl) electrode.

Preferably, the common counter electrode may comprise any material capable of providing a stable common counter electrode. For instance, the common counter electrode may comprise a platinum electrode.

The gas or vapour sensor may comprises a metal fabric or membrane as defined in the second or third aspect. The metal may be silver, gold or platinum. In one embodiment, the metal is silver. In one embodiment, the fabric or membrane is a paper fabric and more preferably a cellulose paper fabric.

Preferably, the gas or vapour sensor further comprises an ohmmeter, ammeter or voltmeter configured to measure the resistance, current or potential difference across the metal fabric or membrane. In a preferred embodiment, the gas or vapour sensor comprises an ohmmeter configured to measure the resistance across the metal fabric or membrane.

All of the features described herein (including any accompanying claims, abstract and drawings), and/or all of the steps of any method or process so disclosed, may be combined with any of the above aspects in any combination, except combinations where at least some of such features and/or steps are mutually exclusive.

For a better understanding of the invention, and to show how embodiments of the same may be carried into effect, reference will now be made, by way of example, to the accompanying Figures, in which:

FIG. 1A shows how silicon micropowder is processed into precursor ink by ballmilling and ultrasonication until particle sizes match fabric pore sizes, and a silicon (Si) ink is produced; FIG. 1B shows how wax barriers are printed onto paper and the silicon ink is then applied; and FIG. 1C shows how the paper is then placed into a bath containing hydrofluoric acid (HF) and metal salts, in particular; Figure C1 shows how metal cations are attracted to electrons in Si valence band; Figure C2 shows how electrons (e−) in the Si are attracted to the deposited metal nuclei, catalysing further reduction of metal cations. Si is subsequently oxidised near the metal nuclei, forming $SiO_2$ that is etched away by the HF solution; and Figure C3 shows how metal cations in solution deposit preferentially on metal nuclei, which grow accordingly. This creates percolation pathways throughout the entire fabric structure, formed around Si microparticles that sit within the fibres;

FIG. 2A shows images taken using an optical microscope of paper with an Si ink printed thereon (left), and the paper after gold has been deposited on the Si particles in an autocatalytic reaction (right); FIG. 2B shows images taken using an optical microscope of cotton fabric (left), and the cotton after a silicon ink has been printed thereon and then silver has been deposited on the Si particles in an autocatalytic reaction (right); FIG. 2C shows SEM images of a fabric with an Si ink printed thereon (left), metal nuclei which have formed on the Si particles after autocatalytic 30 deposition has been allowed to occur for 40 seconds (centre), and metal crystals which have formed on the Si particles after autocatalytic deposition has been allowed to occur for 20 minutes (right); FIG. 2D shows how a metal fabric produced in accordance with the current invention is extremely hydrophilic and binder-free (left), whereas commercially available metal nano-particle ink produce fabrics which are hydrophobic and require a binder (right); and FIG. 2E shows energy-dispersive X-ray (EDX) spectra demonstrating a variety of noble metals that can be autocatalytically deposited;

FIG. 3 shows a table (left) containing the achieved sheet resistances for a range of fabrics with a single autocatalytic coating; a graph (centre) showing how sheet resistance decreases with deposition time, as metal crystals grow larger and form more percolation pathways; and a further graph (right) showing how sheet resistance may be decreased further by sintering at 100° C., with further crystal growth causing coalescence;

FIG. 4A shows an Ag-paper NFC antenna, with metal cost <$0.01, is capable of harvesting 0.4 W; and FIG. 4B shows how further metals may deposited by electroplating, enabling a variety of electrochemical cells such as Zn—Ag or Zn—Cu. Paper Zn—Ag batteries have been fabricated generating $V_{emf}$>2V per cell;

FIGS. 5A and 5B show a μPED that has been fabricated using autocatalytically deposited Ag as the counter and working electrodes; FIGS. 5C to 5E show calibration of the μPED; FIG. 5F shows that methylene blue based DNA detection has been demonstrated with the hybridization of the complementary DNA strains in the presence of another oligo; FIGS. 5G and 5H show that autocatalytic Au paper, coated with streptavidin, has successfully immobilised 50 nM of biotinylated protein; and FIGS. 5I and 5J shows that Au paper has been demonstrated as a substrate for 20) SERS thus enabling pH measurements, by functionalising with 4-MBA (characteristic peak 1,100 cm$^{-1}$), due to protonation of its carboxylic acid end group;

FIG. 6 shows how dependence of the peak current on the scan rate was evaluated by cyclic voltammetry (CV) sweeping the potential from –0.8 to +1.0 V vs. Ag/AgCl at 10, 25, 50, 75, 100, 150 and 200 mV·s$^{-1}$. The metallized Ag paper working electrode (2 cm×2 cm of geometric area) has effective areas of 8.2±0.4 cm$^2$ and 8.6±0.6 cm$^2$ from anodic and cathodic data respectively, calculated from the Randles-Sevcik equation;

FIG. 7 shows how square wave voltammetry of DNA capture show current signals after adding in a row 1 μM capture DNA, 1 μM control DNA and 1 μM target DNA;

FIG. 8 shows binding events on metallized Au paper electrode: (1) SA was immobilised on AuPE through physical adsorption and (2) Biotinylated protein immobilised on the SA;

FIG. 9 is a graph (left) showing CV scans of the SA-AuPE in ECRS at different scan rate ranging from 2 mV/s to 200 mV/s; and a further graph (right) showing SW scans of the biotinylated protein titration at 12.5 nM bitinylated protein to the SA-immobilised AuPE in ECRS at different times;

FIG. 10 shows how metallized silver and gold paper demonstrated as SERS substrates by functionalising with the Raman marker 4-MBA, characterised by peaks at 1,100 and 1,590 cm$^{-1}$;

FIG. 11 is a graph showing how the Ag-paper NFC antenna, of FIG. 4A performed compared to a commercial Ag NFC antenna fabricated by chemical etching on a flex polymer substrate;

FIGS. 12A-D are graphs showing the resistance and current of a silver fabric produced using the present invention; and FIG. 13 is a graph showing how the resistance recorded by a microfluidic device changes when the device is exposed to $NO_2$.

Examples

As explained in the following examples, the inventors have developed a method which overcomes the difficulties of fabric metallization with a binder-free silicon precursor ink. Autocatalytic deposition of metal inside fabrics is enabled at room temperature with ultra-low cost and with tuneable hydrophilicity. Noble metals like Ag, Au and Pt are grown throughout the fibrous materials, harnessing the rough surface to create highly conductive and flexible networks.

Applications of metallic fabrics are also demonstrated, all of which benefit from the uniquely simple and low-cost chemical process. The provision of energy for fabric-based electronic devices is shown with an ultra-low cost near-field communication (NFC) induction antenna for wireless power. The porous and high surface-area metal nanoparticle networks are presented as a strong candidate for paper-based silver-zinc batteries for on-board power. Hydrophilic and conductive metallic paper is then exploited as an electrochemical transducer for deoxyribonucleic acid (DNA) detection in a monolithic device, and for protein immobilization in biosensing applications. Rough metallic nanoparticle surfaces are finally exploited as a plasmonic sensing substrate for surface enhanced Raman spectroscopy (SERS).

Example 1-Preparation of Silicon Ink and Deposition on a Fabric

Materials

Paper substrate was Whatman 4 Qualitative Filter Paper 1004-185 was purchased from GE. Pure cotton fabric was purchased from Amazon. Silicon metal powder was purchased from Pilamec UK Ltd.

Methods

Silicon Precursor Ink

Silicon powder mixed with deionised water (0.1 g ml$^{-1}$) and ground in a Capco 12VS rolling ball mill for 48 hours. Ink was then ultrasonicated in a Branson Digital Sonifier 450 for 40 minutes, with an output power of 240 W. Carboxymethyl cellulose (CMC) was then added, 1 g CMC per 100 ml Si ink.

Paper Electronic Devices

Wax designs have been printed with a Xerox ColorQube 8580 wax printer on Office Depot transparent sheets, and transferred to paper or cotton substrates with a Vevor HP230B heat press at 180° C. Silicon precursor inks have been pipetted and then allowed to dry naturally.

Material Characterisation

Particle size distribution measurements have been made with a Malvern Masterizer 2000 laser diffraction particle size analyser, with 50 mg Si particles dispersed in 20 ml dionised water, measured at pump speed of 1750 rpm.

Optical microscope images have been taken on a Brunel SP202XM metallurgical microscope connected to a Nikon D3200 camera. SEM images are from a Sigma 300.

Results

As well its suitability for autocatalytic deposition, Si is a practical precursor material due to its ultra-low cost and inertness. Si micropowders, costing less than $0.001 per g, have been processed with ball-milling and sonication apparatus resulting in Si particle sizes less than 10 µm in diameter, as shown in FIG. 1A. Particles have been dispersed in water and carboxymethyl cellulose (CMC), which adds viscosity as required, to synthesise a binder-free Si ink.

The manufacture of Si fabrics is shown in FIG. 1B. Hydrophilic channels can be obtained up to 1 mm resolution using a commercial wax printer. As reported by Hamedi in 2016, wax is printed and then briefly annealed at 190° C., causing it to wick through the porous cellulose structure, creating a hydrophobic barrier through the entire cross section of the substrate [19]. The Si ink is then printed on hydrophilic areas where it diffuses between the cellulose or cotton fibres. After solvent evaporation at room temperature the Si remains wrapped around the fibres, as can be seen optically and under scanning electron microscope (SEM) in FIG. 2. Wax barriers enable confinement of the Si precursor ink, permitting Si structures with complex designs.

Example 2-Electroless Deposition

Materials

Silver nitrate ($AgNO_3$), potassium hexachloroplatinate (IV) ($K_2PtCl_6$), potassium tetrachloroaurate (III) ($KAuCl_4$) and hydrofluoric acid (50%) were all purchased from Sigma-Aldrich.

Methods

Fabric substrates with printed Si, prepared according to example 1, were washed with deionised water, submerged in an autocatalytic bath, containing 50 ml of 5 wt % hydrofluoric acid mixed with 2.5 ml of 1M $AgNO_3$, for 20 minutes. The fabric was washed again and then allowed to dry naturally.

When a platinum or gold fabric was produced, then $K_2PtCl_6$ or $KAuCl_4$, respectively, were used instead of $AgNO_3$. The method and molar concentration used were as described above.

Electrical and material characterisation Optical and SEM images were taken as described in example 1. EDX measurements from a LEO Gemini 1525 electron microscope.

Conductivity measurements have been made using rectangle samples, 0.5×4 cm, connected with flat-toothed crocodile clips, outputting to a Tenma T2-7730A multimeter. Seven samples have been made for each material, with results averaged and standard error used.

Results

The Si microparticles disposed in the fabric quickly form an outer layer of relatively inert silicon dioxide ($SiO_2$). This is removed in the HF solution with the anodic oxidation reaction in Equation 1.

$$SiO_2 + 6HF \rightarrow H_2SiF_6 + 2H_2O \quad (1)$$

Figure 1:
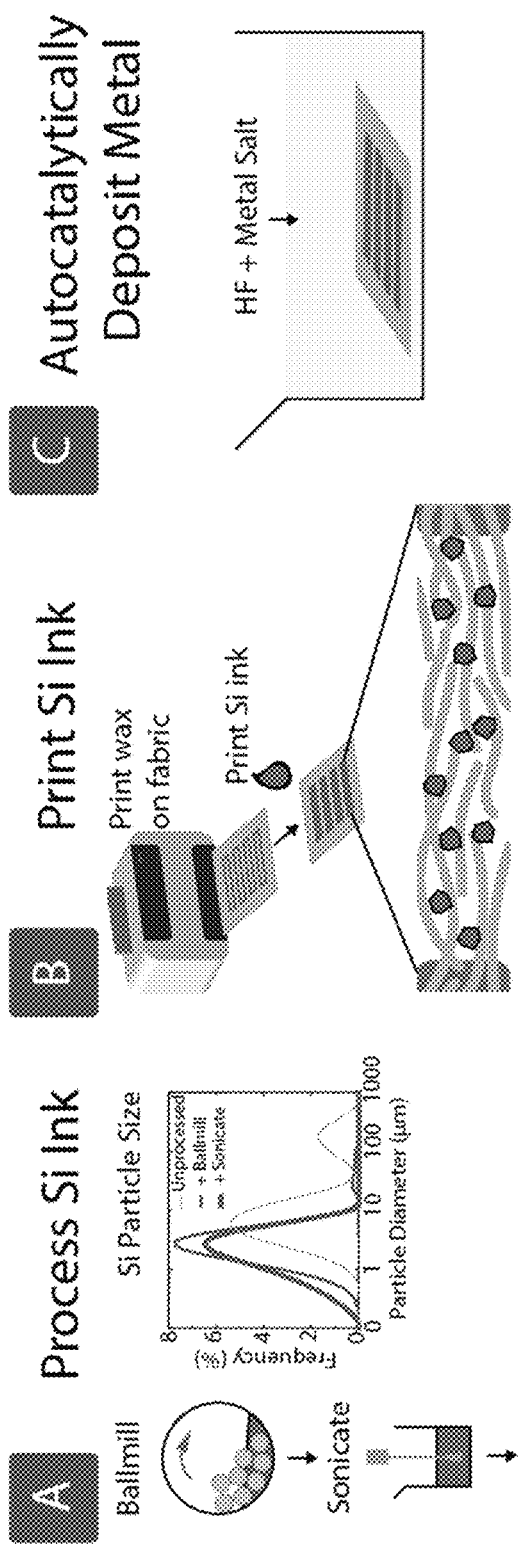
FIG. 1 panel A shows how silicon micropowder is processed into precursor ink by ballmilling and ultrasonication until particle sizes match fabric pore sizes, and a silicon (Si) ink is produced.
Figure 1:
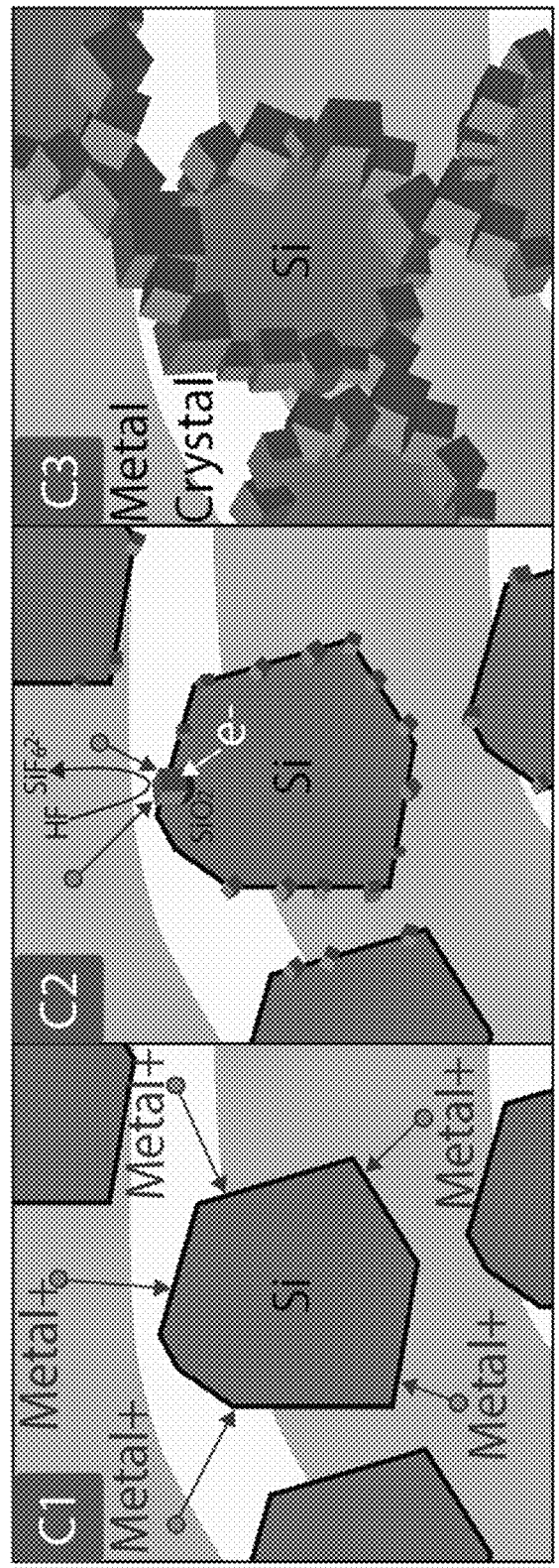

Noble metal ions in close proximity to the silicon attract electrons from the Si valence band, as shown in FIG. 1C1, forming nanoscale metal nuclei on the Si microparticles. The higher electronegativity of noble metals attracts electrons in the Si, causing the metal nuclei to become negatively charged. This catalyses further reduction of metal ions (FIG. 1C2) in a reaction counterpart to Equation 1. The remaining metal ions in solution therefore deposit preferentially on the existing metal nuclei, which grow accordingly as shown in FIG. 1C3. This process also increases oxidation of Si below the metal deposition. The subsequent $SiO_2$ is etched away by the HF solution, allowing the deposited metal to displace it [21,22,24].

It is noted that in this example the inventors use a solution of 5 wt % hydrofluoric acid. This concentration was selected to ensure that the reaction proceeds quickly, and sufficient deposition is observed within 20 minutes. However, the inventors have also observed the autocatalytic reaction occurring when much lower concentrations of hydrofluoric acid are used. For instance, when the inventors used a solution of 0.5 wt % hydrofluoric acid autocatalytic deposition still occurred.

Conductive metal pathways have therefore been grown inside the fabric structures, reaching sheet resistance $R_S < 1\Omega\square^{-1}$. This electroless deposition of metal inside fabrics works at room temperature, is binder free and costs <40 ¢ $cm^{-2}$ for Ag metal. FIG. 2 shows optical images of autocatalytically deposited Au and Ag in paper and cotton fabric respectively. Noble metals Au, Ag and Pt have been deposited inside fabrics, shown in energy-dispersive X-ray (EDX) spectra in FIG. 2E. In contrast to conventional Ag nanoparticle inks, this metallic paper is completely hydrophilic, see FIG. 2D, rendering it ideal for vertical flow assays and wet sensing applications.

Over longer deposition times metal nuclei grow larger as imaged by SEM in FIG. 2C. This generates more conductive pathways and increases conductivity shown in FIG. 3. Sintering is a common post-deposition step for metals on paper, where energy absorbed by the deposited metal particles causes them to melt and coalesce, forming more conductive pathways. While this is typically undertaken close to 200° C., lower temperatures of 100° C. are suitable here due to the high surface area of metal nuclei, which are of the order of 100 nm in diameter. Sintering in an oven has a marked effect of increasing conductivity as shown in FIG. 3.

The electrical behaviour as a result of mechanical bending is shown in FIG. 12A. Measurements were taken from points at fixed distances for six 2 cm long samples. Electrical resistance increases as a result of bending similarly to flexible strain sensors during initial bending cycles. As observed, for bending distances of over 10 mm (bend angle >) 90° the error in measurement increases to indicate the limit of flexibility.

The inventors also noted the durability of the metallic fabric (Ag) under cyclic strain (distance=8 mm, angle=) 90° during 1000 cycles, and the results are shown in FIG. 12B. The resistance increases significantly during the first 30 cycles. Subsequently the response stabilizes and increases minimally after 700 cycles which indicates that the substrate is suitable for flexible applications.

The electrical conductivity of the sample remains suitably high for the applications proposed even after bending. The current-voltage curve for the silver fabric shows a typical resistor behaviour up to 1.5 V, see FIG. 12C. The current-voltage curve for Ag-paper and silver-silver chloride ink for higher and negative voltages using Al contacts show an identical shape, see FIG. 12D.

Example 3-NFC Antenna

Methods

Antennae have been outlined with wax barriers on cellulose paper, as described in example 1. The antenna was then fabricated by depositing Si ink on the cellulose paper, as described in example 1, and then depositing silver on the Si particles, as described in example 2. The antenna was then connected across a 100Ω resistor and placed on the back of an NFC-active phone. The induced voltage across the resistor was measured with a Tektronix TBS 1052B-EDU digital oscilloscope.

Results

A silver near-field communication (NFC) induction antenna was fabricated on cellulose paper, as show in FIG. 4A, using the methods described in examples 1 and 2. This facilitates wireless power and data transfer to monolithic electronic devices inside fabric materials, with ultra-low fabrication cost. Antenna cost is controlled by quantity of silver nitrate ($AgNO_3$) used, which is currently $0.17 per (non-optimised) device.

Quality of antennae is demonstrated in comparison to a commercial NFC antenna in FIGS. 4A and 11, measuring induced voltage across a 100Ω resistor. The paper antenna produced using the methods described in examples 1 and 2 induced root-mean-squared voltage of $V_{rms}$=6.4 V. This was sufficient to power a LED, and could provide 409.6 mW of wireless power to devices on a fabric substrate.

Example 4-Silver battery

Batteries contain electrodes that release chemical energy, via ions in an electrolyte, once connected to an external circuit. The rough and porous structure of paper can be advantageous for batteries, due to the high resultant surface area and electrolyte absorption. Paper based batteries are usually reported with carbon nanotubes, Li-ion, Zn and polymer electrodes [25-28].

Materials

Zinc metal sheet purchased from Sanying Ltd.

Methods

Electrodeposition

Silver paper was prepared in accordance with the methods described in examples 1 and 2. Further wax barriers were added to paper, after electroless deposition, using the same approach described in example 1. Zinc was then deposited on the silver paper by electrodeposition in 1 M $NH_4Cl$ electrolyte. Positive electrode was zinc metal sheet, and negative electrode was silver paper and electrodeposition occurred at a constant voltage of 1 V for 30 minutes. The electrode was then washed with deionised water and dried gently with paper towel, before immediate use in battery.

Battery Fabrication and Characterisation

Silver and zinc electrodes were separated by paper barrier of the same specification. The batteries folded and connected in series, and then laminated with polyethylene in a heat press. A hole was pierced in the polyethylene, through which 250 µl of 2M NaOH electrolyte was added. The circuit was completed with two 100Ω resistors and voltage measured using a Tenma T2-7730A multimeter.

Results

The inventors have grown noble metal nanoparticles through the cross-section of paper via electroless deposition, and a wide range of additional metals can then be deposited by electrodeposition. Wax barriers can be added on top of electrolessly deposited metals making them hydrophobic. This has been exploited to prevent the electrolyte from wicking through the paper to the source electrode. The electrodeposition of a wide range of metals including Zn enables the manufacture of sophisticated Zn—Ag and AgO batteries. It may be appreciated that an AgO electrode could be produced by producing a silver fabric using the methods described in examples 1 and 2 and then anodising the fabric. The inventors therefore present a technique for paper based batteries with high surface area, ultra-low fabrication cost and deposition of a wide range of metal electrodes. The electromotive force of individual Zn—Ag cell is sufficient to power an LED, supplying over 2 V for 20s at constant current, as shown in FIG. 4B. This corresponds to an energy density of 369 mWh $g^{-1}$, greater than the 108 mWh $g^{-1}$ supplied by the paper based Li-ion battery in 2010 by Hu et al [28]. Multiple cells can be fabricated monolithically on one paper substrate, stacked or folded, they are inherently lightweight and can be stored in dry form.

Example 5-DNA Sensing µPED

Microfluidic paper-based electroanalytical devices (µPEDs) enable in-situ laboratory analysis, using minimal reagents and analytes, on cheap and disposable substrates. Microfluidic devices controlling small volumes of fluids were originally conceived for plant extract analysis, but µPEDS are now used, among other applications, for clinical blood analysis of pathogens, proteins and across environmental, pharmaceutical and food industries. They are especially relevant in developing countries with rudimentary diagnostic facilities [29-31].

DNA plays a vital role, not only in genetics, but also in bioanalytics since DNA-DNA interactions are associated with many different diseases. The application of DNA as a diagnostic and prognostic biomarker has therefore recently become an important issue for medicine [32]. The most frequently used method for DNA detection is based on fluorescence markers using a polymerase chain reaction (PCR). These systems, however, often suffer from bulky and expensive equipment for on-site testing. As an alternative, electrochemical DNA detection has been previously reported based on intercalation of redox-active methylene blue (MB) in µPEDs allowing a low-cost and miniaturized realization. Here, the MB molecules bind specifically to the guanine bases during the hybridization process of two single DNA strains. This reduces the MB concentration in the solution and thus leads to decreased redox signals in voltammetry. This approach can be combined with PCR or isothermal amplification in order to enhance the sensitivity [33,34]

Materials

All chemicals used in this work were purchased from Sigma-Aldrich, UK. The employed oligonucleotides including a capture DNA (cDNA) 5'-ttg gcc gat gga ggc gag gt-3', a target DNA (tDNA) complementary to cDNA 5'-acc teg cct cca tcg gcc aa-3', and a control DNA (contDNA) 5'-aac cca tgg aat tca gtt cg-3', were purchased from Biomers.net GmbH, Germany. All solutions and dilutions were prepared in 10 mM phosphate buffered saline (PBS) solution at pH 7.4, containing 138 mM sodium chloride (NaCl), 2.7 mM potassium chloride (KCl).

Methods

Manufacture of μPAD

A microfluidic paper-based electroanalytical device (μPED) was prepared as described below using the methods of examples 1 and 2.

Effective Area Calculation

In order to know the effective area of the metallized Ag-paper electrodes, the dependence of the peak current on the scan rate was evaluated by cyclic voltammetry (CV) sweeping the potential from −0.8 to +1.0 V vs. Ag/AgCl at 10, 25, 50, 75, 100, 150 and 200 mV·s$^{-1}$. As the inset in FIG. 6 shows, a standard Ag/AgCl reference electrode (Fisherbrand Accumet model from FisherScientific, NL) and a graphite rod (Sigma Aldrich), as counter electrode, were placed close to the surface of the Ag—Si paper electrode (2 cm×2 cm of geometric area) which acts as working electrode. The electrochemical cell was connected to the potentiostat (PalmSens3 model from PalmSens, UK) with crocodile clamps. Then, 1 mL of 1 mM K$_4$Fe(CN) 6 solution in 0.1 M KCl was slowly added on the paper electrode, wetting the whole electrochemical cell and avoiding solvent evaporation during the experiment.

According to the Randles-Sevcick equation for a flat electrode and for diffusion-controlled processes at 25° C. [44-47]:

$$ip=(2.69·10^5)n^{3/2}AD^{1/2}Cv^{1/2}$$

Under the same conditions, for adsorption-controlled processes:

$$ip=(2.69·10^5)n^{3/2}AD^{1/2}Cv$$

where ip is the peak current (A), n is the number of electrons transferred (n=1 for ferrocyanide), A the effective area of the electrode (cm$^2$), D is the diffusion coefficient of ferrocyanide in aqueous solutions (6.50·10$^{-6}$ cm$^2$·s$^{-1}$), C is the concentration (1·10$^{-6}$ mol·cm$^{-3}$) and v is the scan rate (V·s$^{-1}$).

Cyclic voltammograms, as those shown in FIG. 6A, were recorded using five different paper substrates without washings between scans. The gradient of the logarithmic plot peak current intensity vs. the scan rate (FIG. 6B) is 0.67±0.08 (R$^2$=0.997) and 0.67±0.09 (R$^2$=0.996), for anodic and cathodic processes, respectively. It is noted that these values do not correspond to the value of 1 as expected for adsorbed electroactive species, or to the value of 0.5 associated with the semi-infinite diffusion of the electroactive species to the electrode. Compton et al. observed a similar behaviour for the detection of nicotine on pyrolytic graphite electrodes modified with layers of multiwalled carbon nanotubes. They obtained a gradient of 0.69 which is indicative of a possible mixed mass transport regime with thin-layer diffusion within the porous conductive layer, and semi-infinite diffusion outside the layer in solution [48]. Ag—Si paper electrode is also a porous material with channels and pores of variable dimensions and mixed behaviour can be observed.

Readjusting the Randles-Sevcik equation with the experimental gradient values, calculated effective areas were 8.2±0.4 cm$^2$ and 8.6±0.6 cm$^2$ from anodic and cathodic data, respectively. These values are at least the double of the geometric area (4.0 cm$^2$).

Evaluation of Implemented Sensing Device

Cyclic (CV) and square wave voltammetry (SWV) analyses have been performed at room temperature with a handheld potentiostat PalmSens3 (PalmSens BV, The Netherlands) with the supplied PSTrace 5.3 software in a three-electrode setup. Prior to the DNA measurements with SWV, the electrode surfaces were pre-treated with cyclic voltammetry to ensure a clean electrode surface. The used pulse amplitude for SWV analysis was 50 mV with a step potential of 2 mV a frequency of 10 Hz, and a potential range between −0.2 and −0.50 V.

Results

In this work, a novel μPED has been designed (FIG. 5A) to demonstrate the proof-of-concept of MB-based DNA analysis. It contains three autocatalytically deposited Ag electrodes, serving as dual working electrodes (WE) and one common counter electrode (CE), and a Ag/AgCl pseudo-reference electrode (RE). As explained above, the effective area of metallized Ag paper electrodes has been calculated using the Randles-Sevcik equation with experimentally measured gradient values 0.67±0.09, demonstrating there is an effective area 2.1 times greater than the geometric area (FIG. 6). In order to prevent an ohmic drop in the μPED device, which can occur due to the foam-like structure of the autocatalytically deposited electrodes, the reference electrode is prepared separately and laminated directly under both working electrodes (FIG. 5B). Lamination can be achieved using any thermoplastic with an appropriate glass transition temperature, such as a polyethylene film.

FIG. 5C illustrates CVs of an autocatalytically deposited Ag electrode in 10 mM PBS and 2.5 mg ml$^{-1}$ methylene blue (MB) with a scan rate of 100 mV s$^{-1}$.

The redox reaction of methylene blue (blue) to leucomethylene blue (colourless) is given in equation 2.

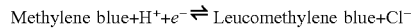

Methylene blue+H$^+$+e$^-$ ⇌ Leucomethylene blue+Cl$^-$

SWV measurements of MB in a concentration range of 10 to 2500 μg ml$^{-1}$ were subsequently performed (FIG. 5D) and a calibration curve was recorded (FIG. 5E). The obtained current is linearly dependent on the MB concentration. The detection limit was less than 50 μg ml$^{-1}$ (1.56 μM) along with a linear behaviour up to a concentration of 1 mg ml$^{-1}$ (31.26 μM). For the DNA measurement, a MB concentration of 250 μg ml$^{-1}$ (7.82 μM) was selected. FIG. 5F shows the current signals of SWV measurements (N=5) with solely MB, after adding in a row 1 μM capture DNA, 1 μM control DNA and 1 μM target DNA. The SWV measurement with DNA is provided in FIG. 7. The inventors results have demonstrated the quantification of the hybridization of complementary DNA strains in the presence of another oligo, also exhibiting the selectivity of this approach.

Further research will concentrate on the combination of this approach along with an amplification technique (e.g., isothermal amplification due to its on-site applicability) as well as the investigation of DNA biomarkers (e.g., *Mycobacterium avium* subsp. paratuberculosis (MAP) in the case of Johne's disease) in real samples.

Example 6-Electrochemical Transducer for Biosensing

Materials

SA, HRP, ferrocenecarboxylic acid (FCA), Avidin, HABA were from Sigma-Aldrich. EZ-Link NHS-Biotin and Zeba spin desalting columns (7K MWCO) were from Thermo Fisher Scientific. Amicon Ultracel-10 was from Millipore. Other common chemicals were from Sigma-Aldrich unless specified.

Methods

The reactive NHS-biotin was conjugated to lysine residues of HPR in phosphate buffer saline (PBS). A series of different NHS-biotin: protein molar ratios were performed to achieve the desired biotinylated level (close to 1 biotin per enzyme molecule). The excessive NHS-biotin was removed using the Zebra spin column. The biotinylation was quantitated using HABA pulling assay. The biotin-conjugated HRP was then transferred to the electrochemical reaction solution (ECRS) containing 2 mM FCA in PBS using the Amicon column. Concentrations of biotinylated HRP were determined using absorbance at 402 nm with an extinction coefficient value $\varepsilon^{402}=102\times103$ $M^{-1}$ $cm^{-1}$ [48]. A strip of the AuPE (approximately 3 mm wide and 15 mm long) was dipped into a well of a 96-well microtiter plate containing 200 μl of 1 μM of SA in 5 mM Borax buffer for 2 hours. The AuPE strip was then washed by consecutive dipping for 2 minutes each in 3 wells of 300 μl of ECRS.

Results

The exceptionally strong affinity of the biotin and streptavidin (SA) interaction has long been exploited for protein and nucleic acid labelling and immobilisation, forming the basis of robust and sensitive biosensors. The SA can be immobilized on a working electrode (WE) by physical adsorption, providing higher surface density than covalent attachment [35]. Biotinylated biomolecules then bind to SA-coated electrodes, taking advantage of the high affinity ($K_d$=10-15M) and fast kinetics of biotin-streptavidin reaction [36]. The effectiveness of SA-biotin interaction and biomolecule immobilization can be tested by adding an electroactive species to the solution such as iron complexes, since increasing the amount of proteins may hamper the electron transfer and diffusion of the reporter to the electrode [37]. Following the methods described in examples 1 and 2, the high surface area and conductivity of paper with autocatalytic Au results in a promising transducer for electrochemical biosensing.

Paper with autocatalytic Au(WE) has been coated with SA and dipped in 200 μL of electrochemical reaction solution (ECRS, see FIG. 8), which contains biotinylated protein and ferrocenecarboxylic acid (FCA) as the electrochemical reporter. In this case, the protein is horseradish peroxidase (HRP) conjugated through one of its lysine groups to biotin with a short spacer (13.5 Å). To complete the electrochemical cell, the Ag/AgCl reference electrode (RE) and a Pt wire counter electrode (CE) are dipped in the solution (inset in FIG. 5G) and electrochemical measurements are performed by cyclic (CV) and square wave (SWV) voltammetries using an Ivium potentiostat. The electrochemical interactions of FCA with metallized gold paper are shown in FIG. 9. Cyclic voltammograms in FIG. 5G reveal a marked decrease in the peak current intensity of 40% (both anodic and cathodic processes) when the electrode is coated with SA, and another 30% once biotinylated HRP is added, meaning that an efficient immobilization of SA and interaction SA-biotinylated protein took place. The amount of biotinylated protein required to cover all the available binding sites was studied by square wave voltammetry (SWV) in ECR solution with increasing volumes of 5 μM HRP-biotin from 2 to 10 μl. Recorded voltammograms are shown in FIG. 5H, where no significant effects in the signal are observed with the increase in concentration. A volume of 2 μl (50 nM) is therefore enough for effective immobilization of proteins on the electrode through SA-biotin interaction. The potential of this ultra-low cost metal-fabric substrate has thus been demonstrated for the development of electrochemical biosensors based on SA-biotinylated protein immobilization (e.g. enzymes or antibodies).

Example 7-SERS Substrate

Methods

The surface of metal nanoparticles inside paper was modified with a thiol ligand by submersing in a 0.1 M NaOH solution with 1 mM 4-mercatobenzoic acid (MBA) for 24 hours to functionalise the surface. Raman measurements were then made in a confocal Raman microscope (WiTEC) with a bright field objective (Zeiss 100× NA 0.9), with 1.2 mW laser at 633 nm. Solutions of pH 4, 7 and 13 were prepared using HCl and NaOH, in which the sample was submerged to either protonate or deprotonate the carboxyl moiety of MBA.

Results

Surface enhanced Raman scattering (SERS) is a promising chemical sensing technique, providing molecule-specific information with high sensitivity. Multiple species can be studied simultaneously, as well as single analytes, since molecular vibrations are readily distinguishable thanks to typically narrow signal. Widespread adoption of SERS as an analytical technique is still limited, however, due to its drawbacks including robustness, stability and reproducibility.

SERS active substrates increase characteristic Raman spectra by $10^8$ and are typically etched, nanoparticle or nanostructured copper, silver or gold. They are mostly prepared by physical deposition methods, not with wet chemistry as in our case, which provide rough but well-defined surfaces that provide a strong enhancement of the Raman signal. Gold and silver nanospheres are the most frequently used system for SERS applications and, while there is an inherent trade-off favouring simplicity over sensitivity, signal enhancement can be obtained with self-assembled clusters of nanospheres [38-41]. Here we present a novel SERS substrate capable of performing reproducible, high throughput and sensitivity SERS measurement, while being stable and resistant in harsh chemical environments. Production can easily be scaled to printed large-area manufacture, rectifying the high price-point that blocks widespread application of SERS devices [42]. Having a hydrophilic substrate for metal nanoparticles also has several proven advantages such as enhanced mass transport, low dosage and high throughput compared to conventional SERS systems [43].

Silver and gold paper substrates have been demonstrated as effective SERS substrates by functionalising with the Raman marker 4-MBA, which is characterised by peaks at 1,100 and 1,590 $cm^{-1}$ in FIG. 10. Measurements to sense pH have been carried out to demonstrate the large numbers of molecules hosted by the gold paper substrate. As previously reported, changes in 4-MBA Raman spectra are due to protonation of its carboxylic acid end group, giving rise to the vibrational mode at 1,430 $cm^{-1}$ in FIGS. 5I and 5J [41].

Example 8-Gas Sensor

Methods

Silver-based metallic paper was produced using the methods of example 1 and example 2 to provide a rectangle of silver paper which was roughly 2 cm×1 cm. The silver paper was connected to a custom-built ohm-meter using crocodile clips disposed either side of the silver paper to measure its conductance when exposed to a gaseous analyte. The device was inserted inside a homemade gas sensor test chamber which could introduce variable concentrations of gases using mass flow controllers.

The high purity calibration gases were purchased from a commercial vendor and used in the experiments without further modifications. The source gases containing the analyte were diluted with high purity dry air. Accordingly, the gas sensor was alternatively exposed to 1000 standard cubic centimetre per minute (sccm) of dry air ("Air") or 900 sccm dry air and 100 sccm of 1% $NO_2$ in $N_2$, i.e. 0.1% $NO_2$ ("$NO_2$").

Results

The results are shown in FIG. 13 and demonstrate sensitivity towards $NO_2$ using an Ag-impregnated paper substrate. In particular, the curve shows a clear linear response, whereby the resistance increases during exposure to a gas mixture containing $NO_2$. This is due to an irreversible reaction with $NO_2$ at the surface of the metal-impregnated paper. This irreversible binding is particularly useful, as the device measures the cumulative exposure to $NO_2$, meaning that, although continuous readout is possible, it does not require continuous power from the mobile handset. Rather the cumulative exposure can be read out intermittently, meaning that there will be minimal impact in the battery life of the handset, as well as reducing the noise in the signal.

CONCLUSION

An electroless deposition technique has been presented that is capable of depositing a wide range of metals inside fabric materials, such as paper and cotton, using a printed precursor silicon ink. The resultant metallic fabrics are highly conductive, electroactive, hydrophilic, flexible, porous and ultra-low cost. These material properties have then been implemented for fabric-based devices capable of energy storage and wireless power. Applications have been demonstrated in electrochemical DNA sensing and transduction for biosensing, and as a plasmonic SERS substrate.

Wirelessly powered (<0.4 W) fabric-based devices are enabled with autocatalytically deposited NFC antenna, retaining a disposably cheap price point. Autocatalytic metal fabrics combined with electroplating enable fabric batteries, combining high surface-area and high hydrophilicity for compact dry storage.

The feasibility of an electrochemical paper-based analytical device for methylene blue based DNA detection was successfully demonstrated by the proof-of-principle measurements using square wave voltammetry. The potential of the ultra-low cost metal-fabric substrate has been demonstrated for the development of electrochemical biosensors based on SA-biotinylated protein immobilization, and as promising substrate for SERS measurements, applied here to pH sensing. Further biosensing work will optimise the system optimization for signal reproducibility and integrate real-time nucleic acid amplification, including polymerase chain reaction (PCR) or isothermal amplification, for point-of-care testing of pathogens.

REFERENCES

1. D. Tobjörk and R. Österbacka, Adv. Mater. 23, 1935 (2011).
2. J. W. Park and S. G. Baek, Scr. Mater. 55, 1139 (2006).
3. P. Andersson, D. Nilsson, P. O. Svensson, M. Chen, A. Malmström, T. Remonen, T. Kugler, and M. Berggren, Adv. Mater. 14, 1460 (2002).
4. A. Denneulin, A. Blayo, J. Bras, and C. Neuman, Prog. Org. Coatings 63, 87 (2008).
5. G.-W. Huang, S. H. Xiao, and S. Fu, Nanoscale 6, 8495 (2014).
6. F. Güder, A. Ainla, J. Redston, B. Mosadegh, A. Glavan, T. J. Martin, and G. M. Whitesides, Angew. Chemie-Int. Ed. 55, 5727 (2016).
7. Y. Gao, X. Deng, W. Wen, X. Zhang, and S. Wang, Biosens. Bioelectron. 92, 529 (2017).
8. A. S. Aricò, P. Bruce, B. Scrosati, J.-M. Tarascon, and W. van Schalkwijk, Nat. Mater. 4, 366 (2005).
9. E. D. Parent, C. S. Purinton, and S. W. Sutter, (1985).
10. K. L. Choy, Prog. Mater. Sci. 48, 57 (2003).
11. F. Erogbogbo, T. Lin, P. M. Tucciarone, K. M. Lajoie, L. Lai, G. D. Patki, P. N. Prasad, and M. T. Swihart, Nano Lett. 13, 451 (2013).
12. A. Eyer, N. Schillinger, I. Reis, and A. Räuber, J. Cryst. Growth 104, 119 (1990).
13. Q. U. Jiuhui, J. Environ. Sci. (China) 20, 1 (2008).
14. N. O'Farrell, A. Houlton, and B. R. Horrocks, Int. J. Nanomedicine 1, 451 (2006).
15. Y. Xia, N. Venkateswaran, D. Qin, and J. Tien, Langmuir 6, 363 (1998).
16. K. Peng, Z. Huang, and J. Zhu, Adv. Mater. 16, 73 (2004).
17. B. Huang, J. Wang, S. Huo, and W. Cai, 81 (2008).
18. G. Peter, W. Fixter, F. Gb, D. Robert, F. Gb, N. Damerell, F. Gb, and S. G. Appleton, US 2004/0146647 A1 (2004).
19. M. M. Hamedi, A. Ainla, F. Güder, D. C. Christodoules, M. T. Fernandez-Abedul, and G. M. Whitesides, Adv. Mater. 28, 5054 (2016).
20. Y. Wang, H. Guo, J. J. Chen, E. Sowade, Y. Wang, K. Liang, K. Marcus, R. R. Baumann, and Z. S. Feng, ACS Appl. Mater. Interfaces 8, 26112 (2016).
21. Z. Huang, N. Geyer, P. Werner, J. De Boor, and U. Gösele, Adv. Mater. 23, 285 (2011).
22. L. A. Nagahara, T. Ohmori, K. Hashimoto, and A. Fujishima, J. Vac. Sci. Technol. A Vacuum, Surfaces, Film. 11, 763 (1993).
23. K. Q. Peng, Y. J. Yan, S. P. Gao, and J. Zhu, Adv. Mater. 14, 1164 (2002).
24. K. Peng, J. Hu, Y. Yan, Y. Wu, H. Fang, Y. Xu, S. Lee, and J. Zhu, Adv. Funct. Mater. 16, 387 (2006).
25. Y. Xuan, M. Sandberg, M. Berggren, and X. Crispin, Org. Electron. 13, 632 (2012).
26. G. Nyström, A. Razaq, M. Strømme, L. Nyholm, and A. Mihranyan, Nano Lett. 9, 3635 (2009).
27. S. H. Ng, J. Wang, Z. P. Guo, J. Chen, G. X. Wang, and H. K. Liu, Electrochim. Acta 51, 23 (2005).
28. L. Hu, H. Wu, F. La Mantia, Y. Yang, and Y. Cui, ACS Nano 4, 5843 (2010).
29. N. Izmailov and M. Shraiber, Farmatsiya 3, 1 (1938).
30. P. Lisowski and P. K. Zarzycki, Chromatographia 76, 1201 (2013).
31. C. Dincer, R. Bruch, A. Kling, P. S. Dittrich, and G. A. Urban, Trends Biotechnol. 35, 728 (2017).
32. A. Ziegler, A. Koch, K. Krockenberger, and A. Großhennig, Hum. Genet. 131, 1627 (2012).
33. T. H. Fang, N. Ramalingam, D. Xian-Dui, T. S. Ngin, Z. Xianting, A. T. Lai Kuan, E. Y. Peng Huat, and G. Hai-Qing, Biosens. Bioelectron. 24, 2131 (2009).
34. A. S. Patterson, K. Hsieh, H. T. Soh, and K. W. Plaxco, Trends Biotechnol. 31, 704 (2013).
35. S. Li, H. Liu, and N. He, J. Nanosci. Nanotechnol. 10, 4875 (2010).
36. P. Weber, D. Ohlendorf, J. Wendoloski, and F. Salemme, Science (80-.). 243, 85 (1989).
37. S. E. Moulton, J. N. Barisci, A. Bath, R. Stella, and G. G. Wallace, Electrochim. Acta 49, 4223 (2004).
38. C. Hamon and L. M. Liz-Marzán, J. Colloid Interface Sci. 512, 834 (2017).

39. D. M. Solís, J. M. Taboada, F. Obelleiro, L. M. Liz-Marzan, and F. J. García De Abajo, ACS Photonics 4, 329 (2017).
40. P. A. Mosier-boss, (2017).
41. A. Lauri, L. Velleman, X. Xiao, E. Cortés, J. B. Edel, V. Giannini, A. Rakovich, and S. A. Maier, ACS Photonics 4, 2070 (2017).
42. J. F. Betz, W. W. Yu, Y. Cheng, I. M. White, and G. W. Rubloff, Phys. Chem. Chem. Phys. 16, 2224 (2014).
43. J. Shao, L Tong, S. Tang, Z. Guo, H. Zhang, P. Li, H. Wang, C. Du, and X. F. Yu, ACS Appl. Mater. Interfaces 7, 5391 (2015).
44. T. R. L. C. Paix?? o, D. Lowinsohn, and M. Bertotti, J. Agric. Food Chem. 54, 3072 (2006).
45. M. Lukaszewski, M. Soszko, and A. Czerwiński, Int. J. Electrochem. Sci. 11, 4442 (2016).
46. S. Trasatti and O. A. *Petrii*, J. Electroanal. Chem. 327, 353 (1992).
47. A. J. Bard and L. R. Faulkner, Electrochemical Methods: Fundamentals and Applications (2001).
48. A. T. Smith, S. A. Sanders, R. N. F. Thorneley, J. F. Burke, and R. R. C. Bray, Eur. J. Biochem. 207, 507 (1992).

The invention claimed is:

1. A method of manufacturing a flexible hydrophilic and porous metal membrane, the method comprising:
    providing a binder free ink comprising a plurality of semiconductor particles and a stabiliser disposed in a first solvent, wherein the semiconductor particles comprise an inorganic semiconductor;
    applying a hydrophobic material to a flexible hydrophilic and porous membrane in a manner configured to define hydrophilic channels on the flexible hydrophilic and porous membrane, wherein the flexible hydrophilic and porous membrane is a flexible nitrocellulose membrane;
    after the application of the hydrophobic material, applying the binder free ink to the hydrophilic channels on the flexible hydrophilic and porous membrane to obtain a flexible hydrophilic and porous membrane comprising a plurality of semiconductor particles; and
    contacting the flexible hydrophilic and porous membrane comprising the plurality of semiconductor particles with a deposition solution comprising a second solvent, an autocatalytic agent, and metal cations; wherein the autocatalytic agent comprises hydrofluoric acid (HF) or a fluoride salt and the semiconductor particles comprise an oxidised outer layer and the autocatalytic agent is configured to react with the oxidised outer layer and thereby remove the oxidised outer layer from the semiconductor particles; and to thereby cause a reaction to occur such that the metal cations are reduced and at least partially displace the semiconductor particles, to thereby provide the flexible hydrophilic and porous metal membrane.

2. A method according to claim 1, wherein the semiconductor particles comprise silicon particles.

3. A method according to claim 1, wherein the concentration of the semiconductor particles in the first solvent is between 1 mg ml$^{-1}$ and 10 g ml$^{-1}$.

4. A method according to claim 1, wherein the second solvent comprises water.

5. A method according to claim 1, wherein, the autocatalytic agent comprises hydrofluoric acid (HF).

6. A method according to claim 1, wherein the metal cations comprise ruthenium cations, rhodium cations, palladium cations, silver cations, osmium cations, iridium cations, platinum cations, gold cations or copper cations.

7. A method according to claim 1, wherein the method comprises applying a further deposition solution comprising a solvent, an autocatalytic agent and further metal cations to the flexible hydrophilic and porous membrane to thereby cause a further autocatalytic reaction to occur such that the further metal cations are reduced and at least partially displace the semiconductor particles, wherein the further metal cations in the further deposition solution are cations of a different metal to the metal cations in the first deposition solution.

8. A method according to claim 1, wherein the method comprises electrodepositing a further metal on the flexible hydrophilic and porous metal of membrane.

9. A method according to claim 1, wherein the method comprises sintering the flexible hydrophilic and porous metal fabric or membrane.

10. The method according to claim 1, wherein prior to applying the binder free ink to the hydrophilic channels the method comprises annealing the hydrophobic material.

11. The method according to claim 1, wherein the hydrophobic material comprises a wax.

12. The method according to claim 1, wherein the first solvent comprises water and the stabiliser comprises a water soluble polymer.

13. The method of claim 1, wherein the semiconductor particles are each at least 0.5 μm.

14. The method of claim 1, wherein the flexible hydrophilic and porous metal membrane produced by the method is configured for use as a microfluidic device.

* * * * *